US012159562B2

(12) United States Patent
Yoshizawa et al.

(10) Patent No.: US 12,159,562 B2
(45) Date of Patent: Dec. 3, 2024

(54) OPTICAL SCANNING DEVICE, METHOD OF DRIVING OPTICAL SCANNING DEVICE, AND IMAGE DRAWING SYSTEM

(71) Applicant: FUJIFILM Corporation, Tokyo (JP)

(72) Inventors: Hirotoshi Yoshizawa, Kanagawa (JP);
Shinichiro Sonoda, Kanagawa (JP);
Yoshikazu Hishinuma, Kanagawa (JP);
Nobuya Tanaka, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/152,816

(22) Filed: Jan. 11, 2023

(65) Prior Publication Data
US 2023/0162635 A1 May 25, 2023

Related U.S. Application Data

(63) Continuation of application No. PCT/JP2021/024390, filed on Jun. 28, 2021.

(30) Foreign Application Priority Data

Jul. 31, 2020 (JP) ................. 2020-130628

(51) Int. Cl.
*G09G 3/02* (2006.01)
*G01B 7/30* (2006.01)
(Continued)

(52) U.S. Cl.
CPC ............... *G09G 3/025* (2013.01); *G01B 7/30* (2013.01); *G02B 26/0858* (2013.01);
(Continued)

(58) Field of Classification Search
CPC .......... H02N 2/028; H02N 2/06; H02N 2/062; H02N 2/04; G02B 26/101; G02B 26/0858; G01B 7/30; G09G 3/346; G09G 3/025
See application file for complete search history.

(56) References Cited

U.S. PATENT DOCUMENTS

2010/0079836 A1 4/2010 Rothaar
2018/0065149 A1 3/2018 Morikawa et al.
(Continued)

FOREIGN PATENT DOCUMENTS

JP 2012-185194 A 9/2012
JP 2017-111316 A 6/2017
(Continued)

OTHER PUBLICATIONS

International Preliminary Report on Patentability and English translation of the Written Opinion of the International Searching Authority for International Application No. PCT/JP2021/024390, dated Feb. 9, 2023.
International Search Report for International Application No. PCT/JP2021/024390, dated Aug. 31, 2021, with English translation.
Extended European Search Report for European Application No. 21849734.5, dated Dec. 8, 2023.
(Continued)

*Primary Examiner* — Yaron Cohen
(74) *Attorney, Agent, or Firm* — Birch, Stewart, Kolasch & Birch, LLP

(57) ABSTRACT

A processor applies a first driving signal having a first driving frequency to a first actuator, applies a second driving signal having a second driving frequency to a second actuator, generates a first angle detection signal by performing first frequency filter processing based on the first driving frequency on an output signal of a first angle detection sensor, generates a second angle detection signal by per-
(Continued)

forming second frequency filter processing based on the second driving frequency on an output signal of a second angle detection sensor, derives a first angle, which is an angle of a mirror portion around a first axis, based on the first angle detection signal, derives a second angle, which is an angle of the mirror portion around a second axis, based on the second angle detection signal, adjusts the first driving signal based on the first angle, and adjusts the second driving signal based on the second angle.

9 Claims, 27 Drawing Sheets

(51) Int. Cl.
*G02B 26/08* (2006.01)
*G02B 26/10* (2006.01)
*H02N 2/02* (2006.01)
*H02N 2/06* (2006.01)

(52) U.S. Cl.
CPC ........... *G02B 26/101* (2013.01); *H02N 2/028* (2013.01); *H02N 2/062* (2013.01)

(56) References Cited

U.S. PATENT DOCUMENTS

| | | |
|---|---|---|
| 2018/0106903 A1 | 4/2018 | Iida et al. |
| 2018/0176524 A1* | 6/2018 | Kobori ............... G02B 27/0101 |
| 2018/0226007 A1 | 8/2018 | Yamada |
| 2021/0223539 A1 | 7/2021 | Naono |

FOREIGN PATENT DOCUMENTS

| | | |
|---|---|---|
| JP | 2018-63228 A | 4/2018 |
| JP | 2018-101040 A | 6/2018 |
| JP | 2019-82634 A | 5/2019 |
| WO | WO 2020/085063 A1 | 4/2020 |

OTHER PUBLICATIONS

Japanese Office Action for Japanese Application No. 2022-540087, dated Jan. 23, 2024, with an English translation.

* cited by examiner

FIG. 11
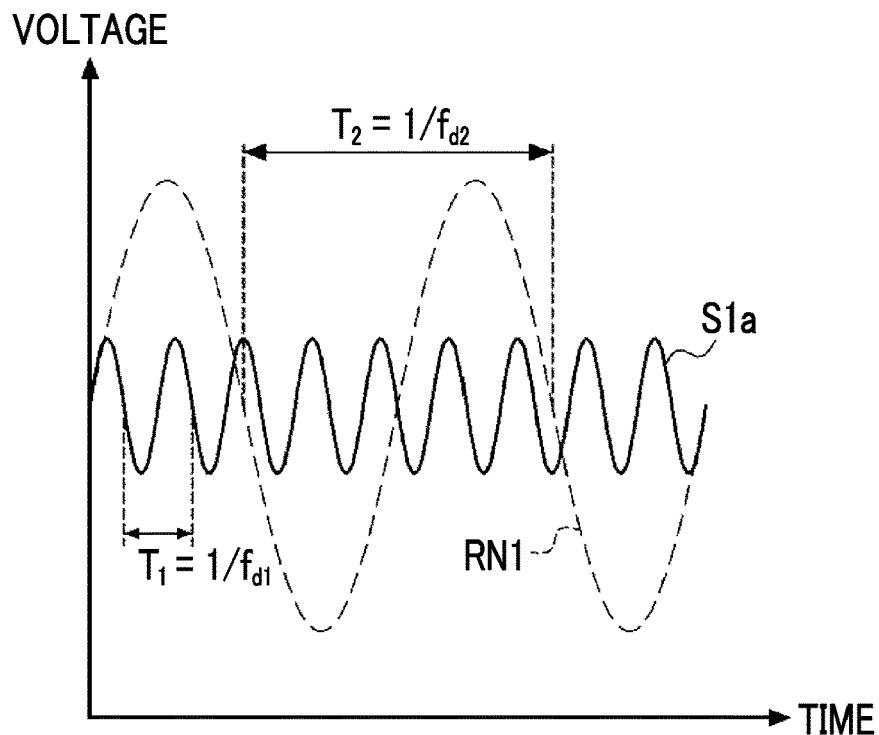
SUPERIMPOSITION
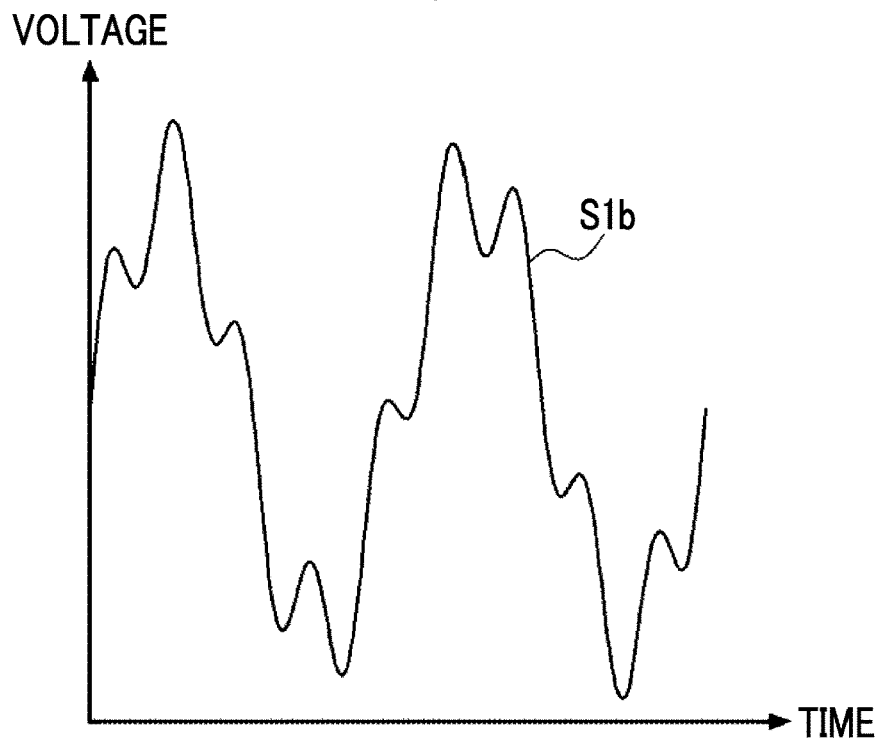

FIG. 12
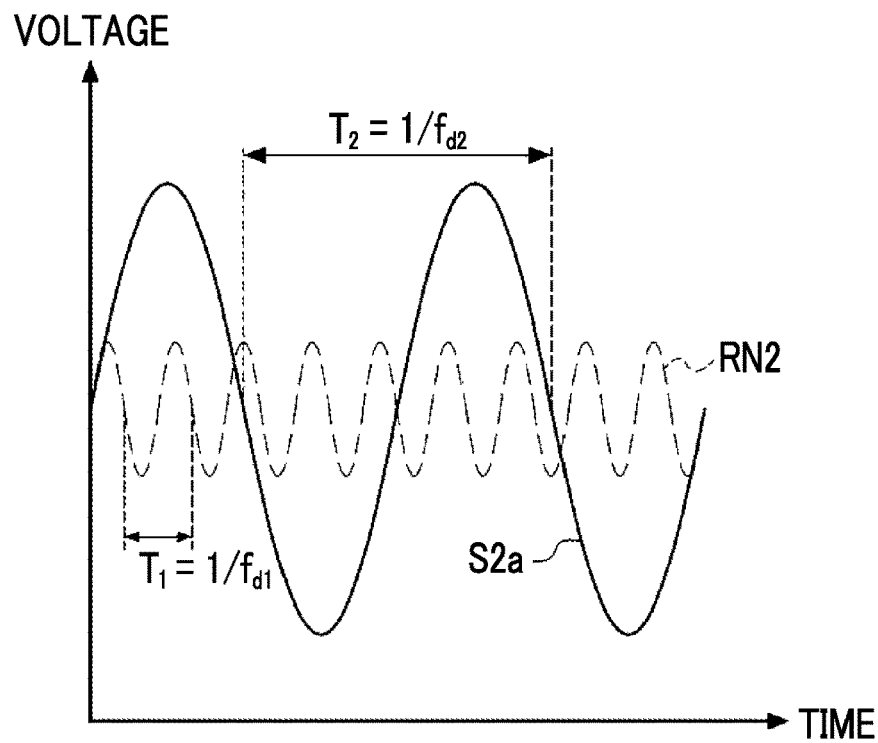
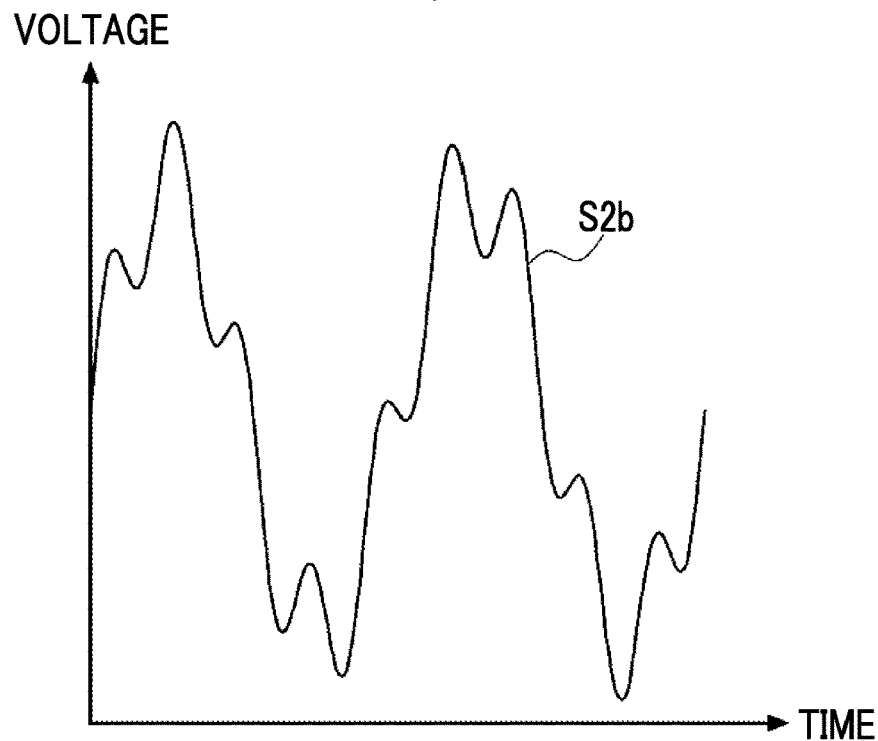

FIG. 14
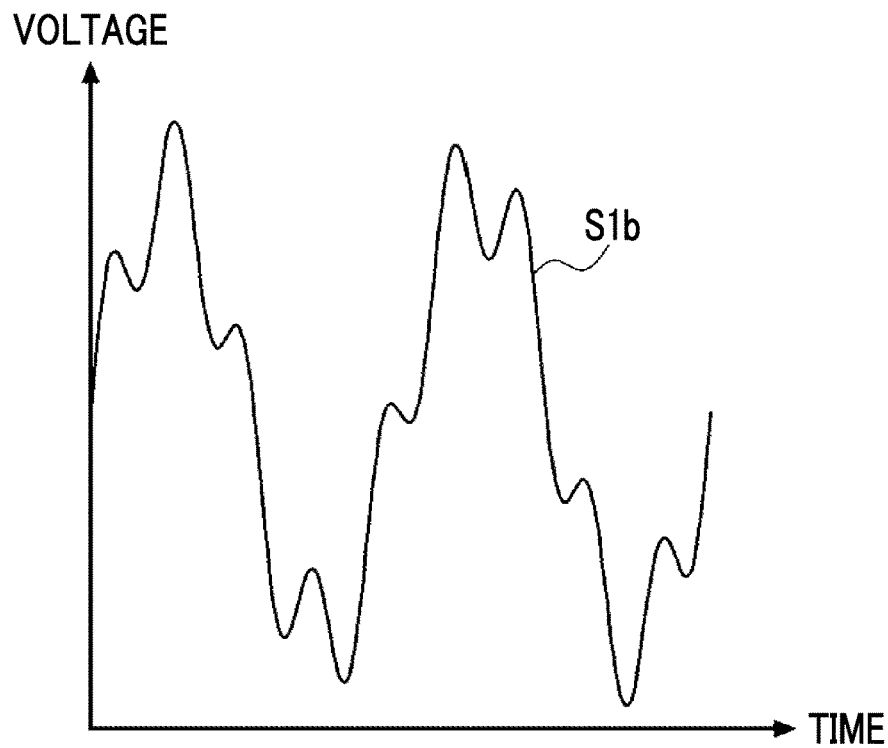
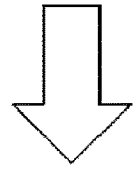
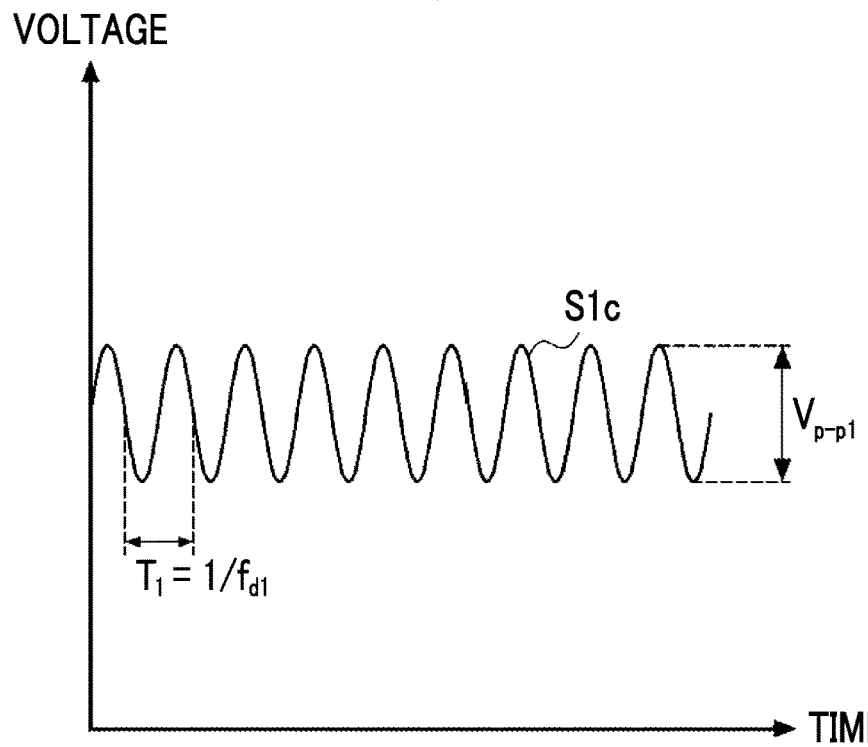

FIG. 16
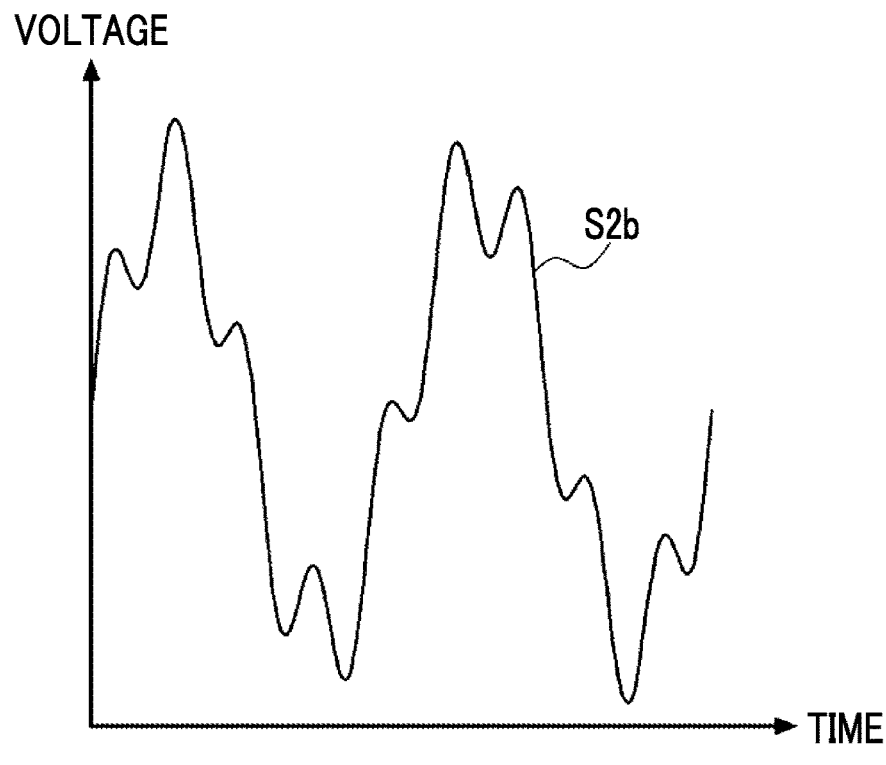
SECOND FREQUENCY FILTER PROCESSING
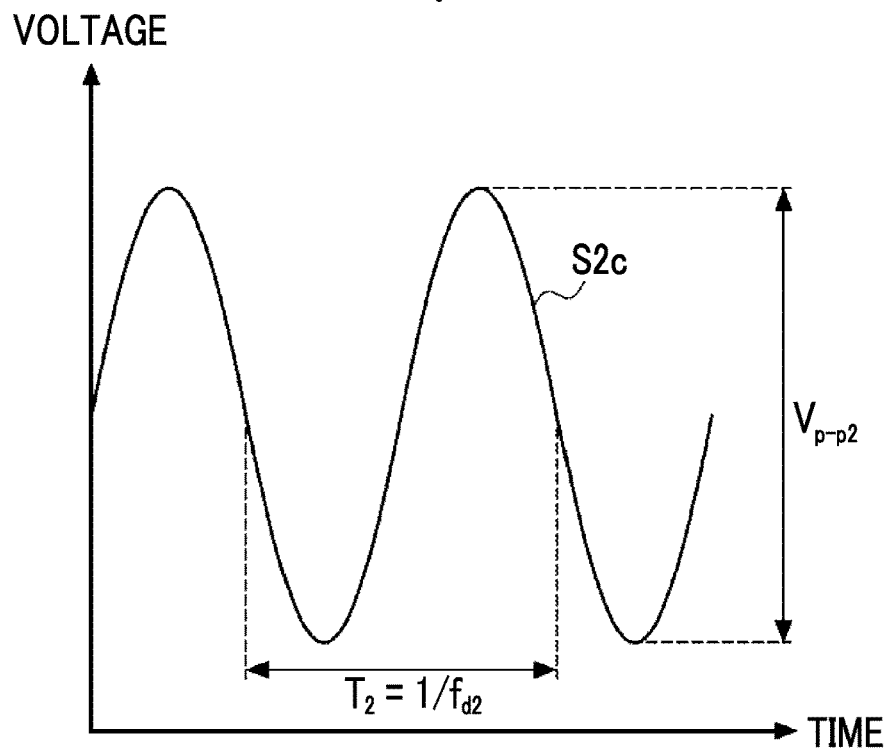

FIG. 23
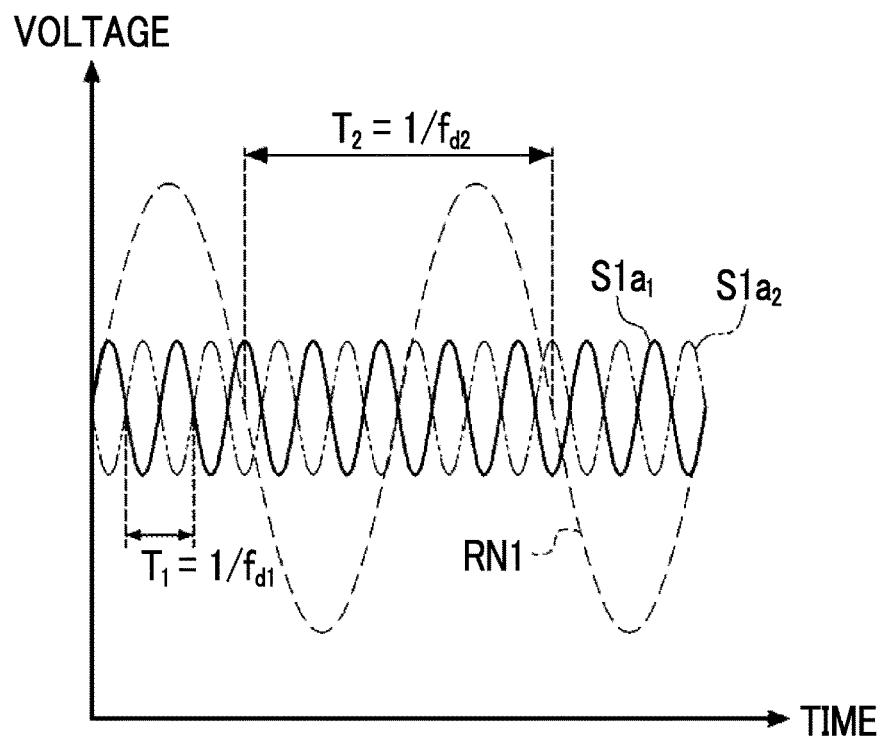
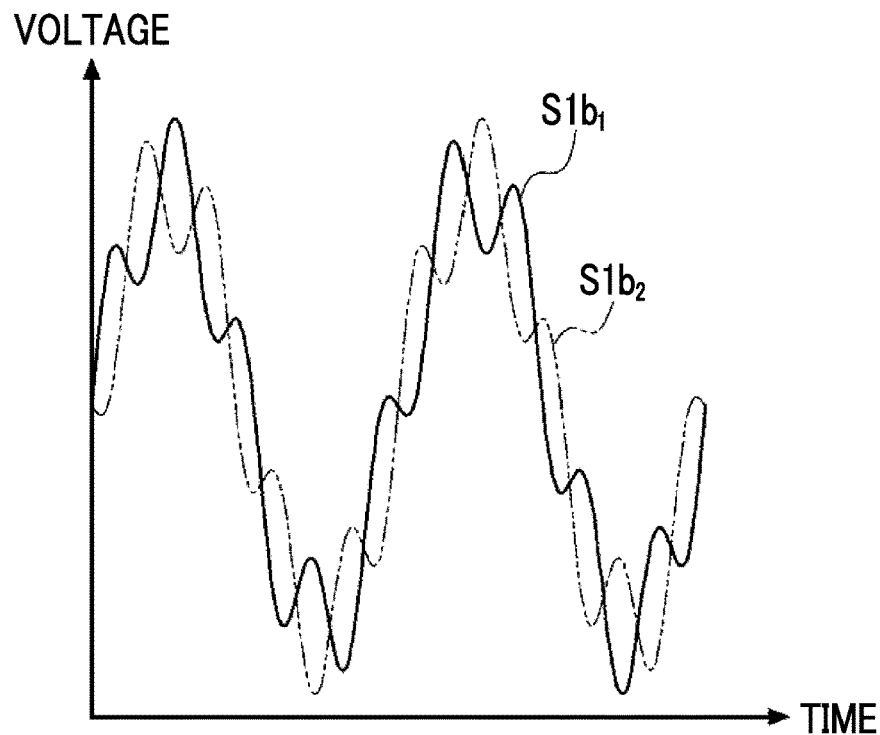

FIG. 24
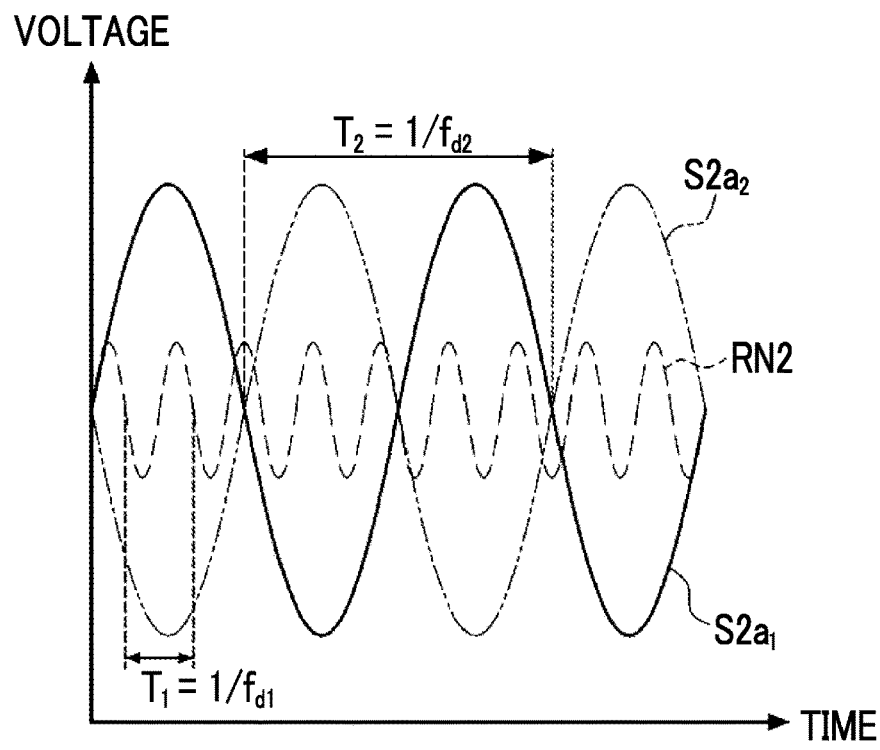
SUPERIMPOSITION
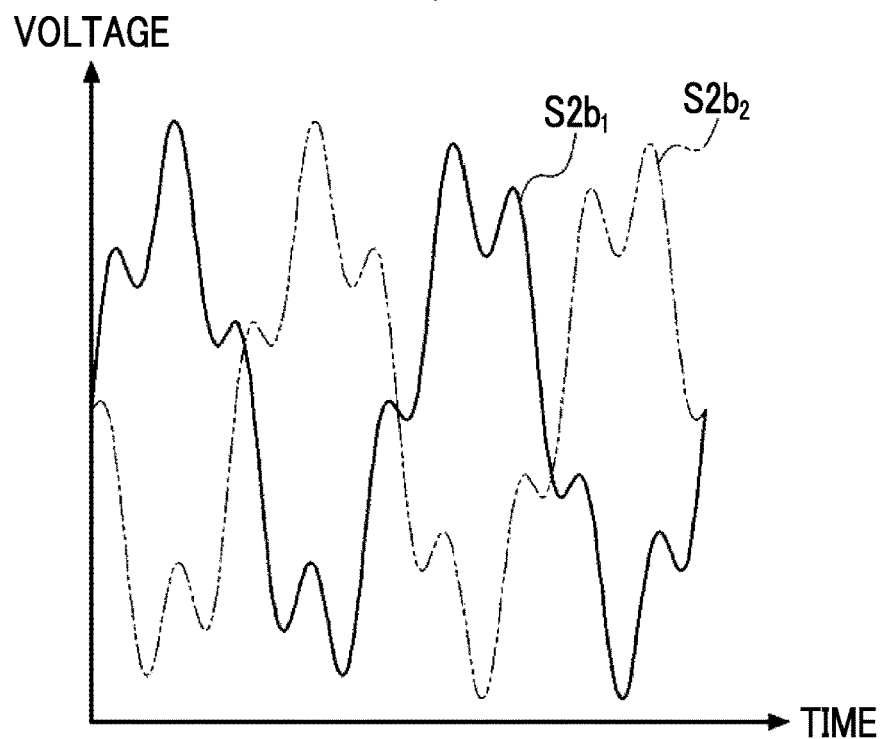

OPTICAL SCANNING DEVICE, METHOD OF DRIVING OPTICAL SCANNING DEVICE, AND IMAGE DRAWING SYSTEM

CROSS-REFERENCE TO RELATED APPLICATION

This application is a continuation application of International Application No. PCT/JP2021/024390, filed Jun. 28, 2021, the disclosure of which is incorporated herein by reference in its entirety. Further, this application claims priority from Japanese Patent Application No. 2020-130628 filed on Jul. 31, 2020, the disclosure of which is incorporated herein by reference in its entirety.

BACKGROUND

1. Technical Field

The technique of the present disclosure relates to an optical scanning device, a method of driving the optical scanning device, and an image drawing system.

2. Description of the Related Art

A micromirror device (also referred to as a microscanner) is known as one of micro electro mechanical systems (MEMS) devices manufactured using the silicon (Si) nanofabrication technique. Since an optical scanning device comprising the micromirror device is small and has low power consumption, it is expected to have a range of applications in an image drawing system such as a laser display or a laser projector.

In the micromirror device, a mirror portion is formed to be swingable around a first axis and a second axis that are orthogonal to each other, and two-dimensional scan with light reflected by the mirror portion is made by allowing the mirror portion to swing around each axis. In addition, there is known a micromirror device capable of performing Lissajous scanning with light by allowing the mirror portion to resonate around each axis.

In such a micromirror device, in order to accurately control a deflection angle of the mirror portion, it is known to provide an angle detection sensor that outputs a signal corresponding to an angle of the mirror portion (for example, see JP2019-082634A and JP2018-063228A).

JP2019-082634A discloses "obtaining an amplitude of rotation of a mirror portion based on an output signal of a detection signal acquisition unit". Specifically, JP2019-082634A discloses "obtaining a peak to peak (P-P) value of a change of a signal voltage corresponding to rotation of the mirror portion, and obtaining an amplitude of rotation of the mirror portion based on data indicating a relationship between the signal voltage and the amplitude of rotation of the mirror portion". The amplitude of rotation of the mirror portion corresponds to the maximum value of the deflection angle (hereinafter, the maximum deflection angle).

JP2018-063228A discloses "acquiring a swing angle of a MEMS mirror based on an amount of change in an angle of the MEMS mirror with respect to a resonance direction in a case where the MEMS mirror is driven at a resonance frequency".

SUMMARY

JP2019-082634A and JP2018-063228A disclose that a first angle detection sensor that detects an angle of the mirror portion around a first axis and a second angle detection sensor that detects an angle of the mirror portion around a second axis are provided. However, in a case where the mirror portion swings around the first axis and the second axis simultaneously, a vibration component caused by the swing of the mirror portion around the second axis is superimposed on an output signal of the first angle detection sensor. A vibration component caused by the swing of the mirror portion around the first axis is superimposed on the output signal of the second angle detection sensor. As described above, in a biaxial drive type micromirror device, there is a problem that vibration of an axis different from an axis to be detected is superimposed as noise on an output signal of an angle detection sensor. Hereinafter, this noise is referred to as a vibration noise.

As described above, in a case where a vibration noise is superimposed on the output signal of the angle detection sensor, an amplitude of the output signal cannot be accurately obtained, and it is difficult to accurately control a deflection angle of the mirror portion.

According to the technique of the present disclosure, it is possible to provide an optical scanning device, a method of driving the optical scanning device, and an image drawing system which can accurately control a deflection angle of a mirror portion.

In order to achieve the above object, according to the present disclosure, there is provided an optical scanning device comprising: a mirror portion having a reflecting surface for reflecting incident light; a first actuator that allows the mirror portion to swing around a first axis located in a plane including the reflecting surface of the mirror portion in a stationary state; a second actuator that allows the mirror portion to swing around a second axis which is located in the plane including the reflecting surface of the mirror portion in the stationary state and is orthogonal to the first axis; a first angle detection sensor that outputs a signal corresponding to an angle of the mirror portion around the first axis; a second angle detection sensors that outputs a signal corresponding to an angle of the mirror portion around the second axis; and at least one processor, in which the processor applies a first driving signal having a first driving frequency to the first actuator, applies a second driving signal having a second driving frequency to the second actuator, generates a first angle detection signal by performing first frequency filter processing based on the first driving frequency on an output signal of the first angle detection sensor, generates a second angle detection signal by performing second frequency filter processing based on the second driving frequency on an output signal of the second angle detection sensor, derives a first angle, which is the angle of the mirror portion around the first axis, based on the first angle detection signal, derives a second angle, which is the angle of the mirror portion around the second axis, based on the second angle detection signal, adjusts the first driving signal based on the first angle, and adjusts the second driving signal based on the second angle.

It is preferable that the processor adjusts the first driving signal in a case where the first angle does not satisfy a first condition, and adjusts the second driving signal in a case where the second angle does not satisfy a second condition.

It is preferable that the processor adjusts voltage values of the first driving signal and the second driving signal.

It is preferable that the first frequency filter processing is band pass filter processing of extracting a signal component of a first frequency band including the first driving frequency, and that the second frequency filter processing is band pass filter processing of extracting a signal component of a second frequency band including the second driving frequency.

It is preferable that each of the first angle detection sensor and the second angle detection sensor is a piezoelectric element.

It is preferable that each of the first driving signal and the second driving signal is a sinusoidal wave.

It is preferable that each of the first angle and the second angle is an angle representing a maximum deflection angle of the mirror portion, and that the processor adjusts amplitudes of the first driving signal and the second driving signal based on the first angle and the second angle.

According to the present disclosure, there is provided an image drawing system comprising: the optical scanning device according to any one of the aspects; and a light source that irradiates the mirror portion with light, in which the processor drives the light source based on the first angle and the second angle.

It is preferable that the processor controls a light irradiation timing of the light source based on the first angle and the second angle.

According to the present disclosure, there is provided a method of driving an optical scanning device including a mirror portion having a reflecting surface for reflecting incident light, a first actuator that allows the mirror portion to swing around a first axis located in a plane including the reflecting surface of the mirror portion in a stationary state, a second actuator that allows the mirror portion to swing around a second axis which is located in the plane including the reflecting surface of the mirror portion in the stationary state and is orthogonal to the first axis, a first angle detection sensor that outputs a signal corresponding to an angle of the mirror portion around the first axis, and a second angle detection sensors that outputs a signal corresponding to an angle of the mirror portion around the second axis, the method comprising: applying a first driving signal having a first driving frequency to the first actuator; applying a second driving signal having a second driving frequency to the second actuator; generating a first angle detection signal by performing first frequency filter processing based on the first driving frequency on an output signal of the first angle detection sensor; generating a second angle detection signal by performing second frequency filter processing based on the second driving frequency on an output signal of the second angle detection sensor; deriving a first angle, which is the angle of the mirror portion around the first axis, based on the first angle detection signal; deriving a second angle, which is the angle of the mirror portion around the second axis, based on the second angle detection signal; adjusting the first driving signal based on the first angle; and adjusting the second driving signal based on the second angle.

According to the technique of the present disclosure, it is possible to provide an optical scanning device, a method of driving the optical scanning device, and an image drawing system which can accurately control a deflection angle of a mirror portion.

BRIEF DESCRIPTION OF THE DRAWINGS

Exemplary embodiments according to the technique of the present disclosure will be described in detail based on the following figures, wherein:

FIG. 11 is a diagram showing an example of a signal output from a first angle detection sensor,
FIG. 12 is a diagram showing an example of a signal output from a second angle detection sensor,
FIG. 14 is a diagram showing first frequency filter processing,
FIG. 16 is a diagram showing second frequency filter processing,
FIG. 23 is a diagram showing an example of signals output from a pair of first angle detection sensors,
FIG. 24 is a diagram showing an example of signals output from a pair of second angle detection sensors.

DETAILED DESCRIPTION

An example of an embodiment relating to the technique of the present disclosure will be described with reference to the accompanying drawings.

First Embodiment

Figure 1:
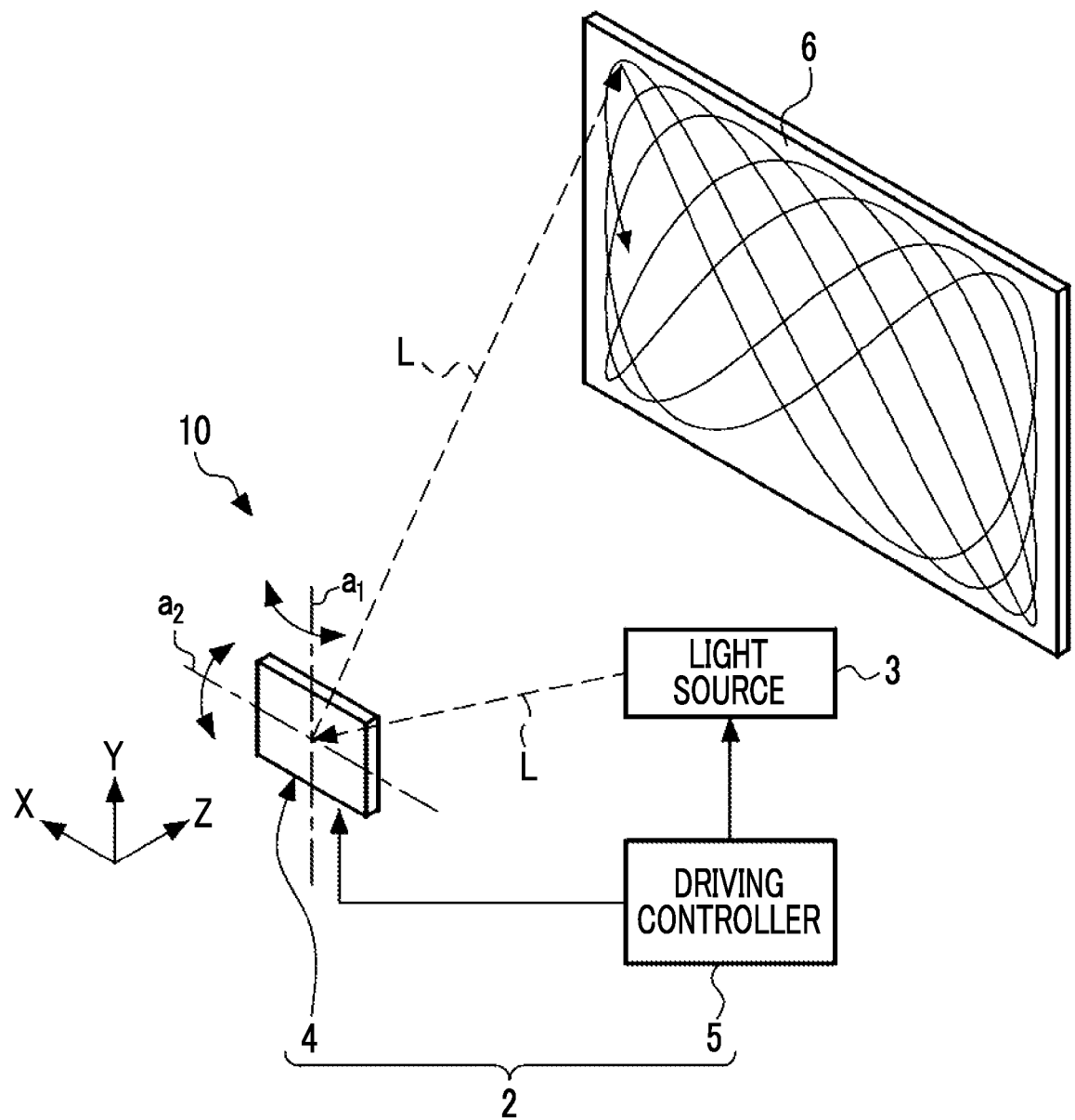
FIG. 1 is a schematic view of an optical scanning device.

FIG. 1 schematically shows an image drawing system 10 according to an embodiment. The image drawing system 10 includes an optical scanning device 2 and a light source 3. The optical scanning device 2 includes a micromirror device (hereinafter, referred to as micromirror device (MMD)) 4 and a driving controller 5. The driving controller 5 is an example of a "processor" according to the technique of the present disclosure.

The image drawing system 10 draws an image by reflecting a light beam L emitted from the light source 3 by the MMD 4 and optically scanning a surface to be scanned 6 with the reflected light beam under the control of the driving controller 5. The surface to be scanned 6 is, for example, a screen.

The image drawing system 10 is applied to, for example, a Lissajous scanning type laser display. Specifically, the image drawing system 10 can be applied to a laser scanning display such as augmented reality (AR) glass or virtual reality (VR) glass.

The MMD 4 is a piezoelectric biaxial drive type micromirror device capable of allowing a mirror portion 20 (see FIG. 2) to swing around a first axis $a_1$ and a second axis $a_2$ orthogonal to the first axis $a_1$. Hereinafter, the direction parallel to the second axis $a_2$ is referred to as an X direction, the direction parallel to the first axis $a_1$ is a Y direction, and the direction orthogonal to the first axis $a_1$ and the second axis $a_2$ is referred to as a Z direction.

The light source 3 is a laser device that emits, for example, laser light as the light beam L. It is preferable that the light source 3 emits the light beam L perpendicularly to a reflecting surface 20A (see FIG. 2) included in the mirror portion 20 in a state where the mirror portion 20 of the MMD 4 is stationary. In a case where the light beam L is emitted from the light source 3 perpendicularly to the reflecting surface 20A, the light source 3 may become an obstacle in scanning the surface to be scanned 6 the light beam L for drawing. Therefore, it is preferable that the light beam L emitted from the light source 3 is controlled by an optical system to be emitted perpendicularly to the reflecting surface 20A. The optical system may include a lens or may not include a lens. An angle at which the light beam L emitted from the light source 3 is applied to the reflecting surface 20A is not limited to the perpendicular direction, and the light beam L may be emitted obliquely to the reflecting surface 20A.

The driving controller 5 outputs a driving signal to the light source 3 and the MMD 4 based on optical scanning information. The light source 3 generates the light beam L based on the input driving signal and emits the light beam L to the MMD 4. The MMD 4 allows the mirror portion 20 to swing around the first axis $a_1$ and the second axis $a_2$ based on the input driving signal.

As will be described in detail below, the driving controller 5 allows the mirror portion 20 to resonate around the first axis $a_1$ and the second axis $a_2$, so that the surface to be scanned 6 is scanned with the light beam L reflected by the mirror portion 20 such that a Lissajous waveform is drawn. This optical scanning method is called a Lissajous scanning method.

Figure 2:
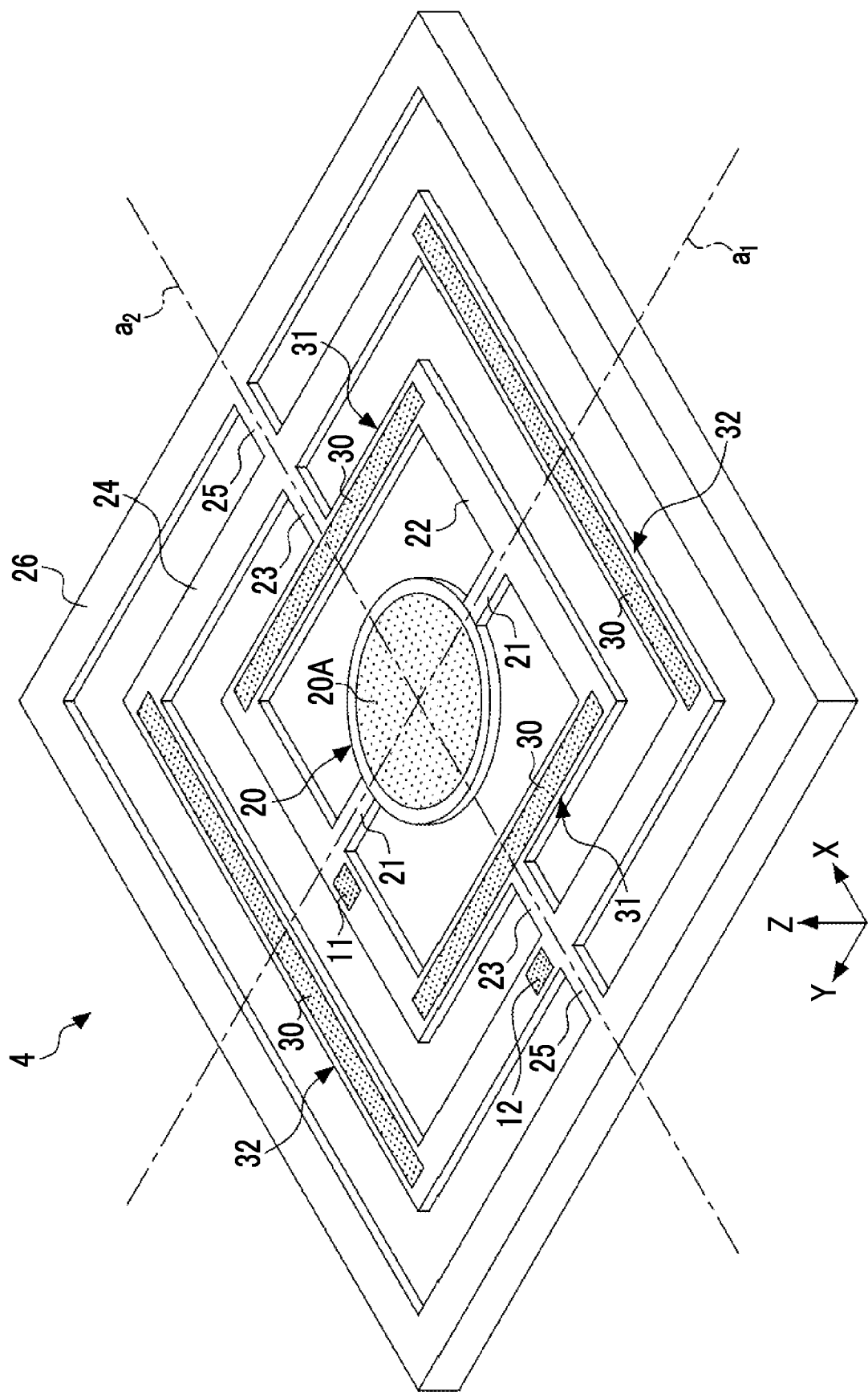
FIG. 2 is an external perspective view of a micromirror device.
Figure 3:
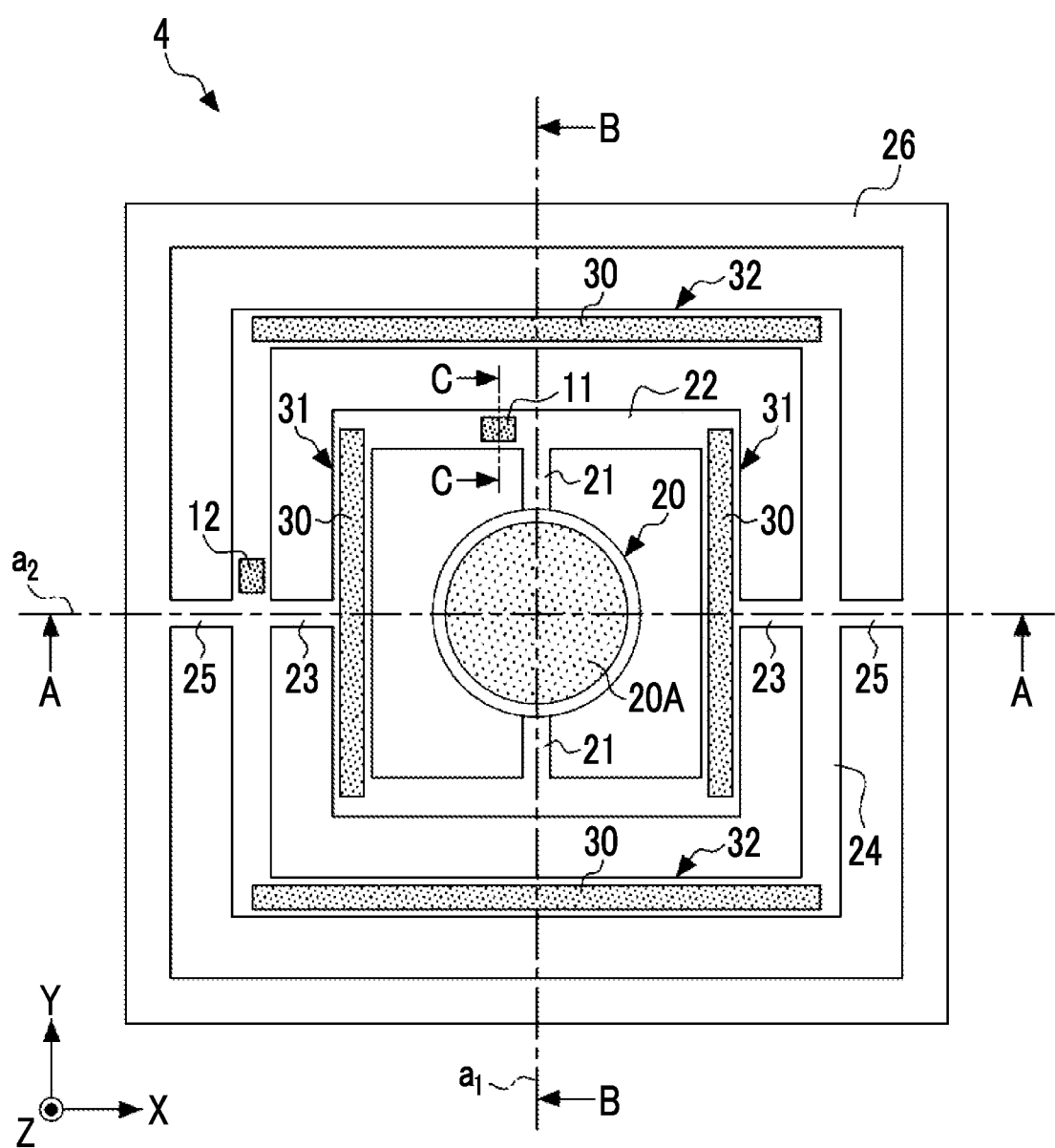
FIG. 3 is a plan view of the micromirror device as viewed from a light incident side.
Figure 4:
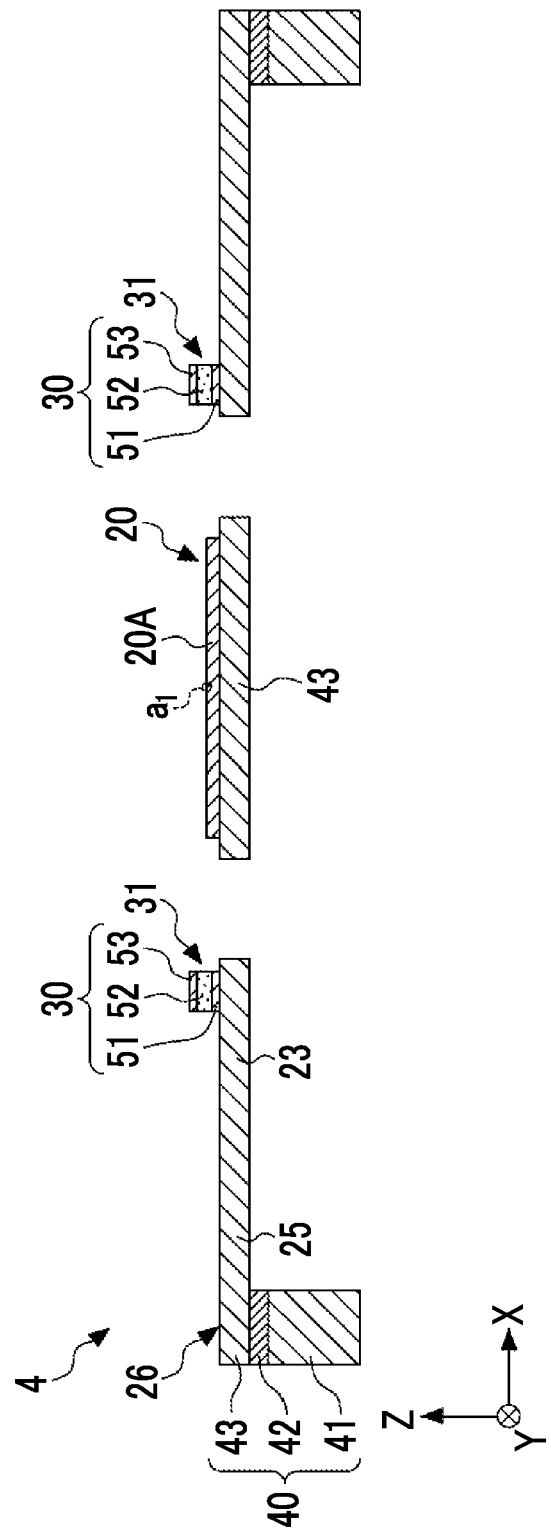
FIG. 4 is a cross-sectional view taken along the line A-A of FIG. 3.
Figure 5:
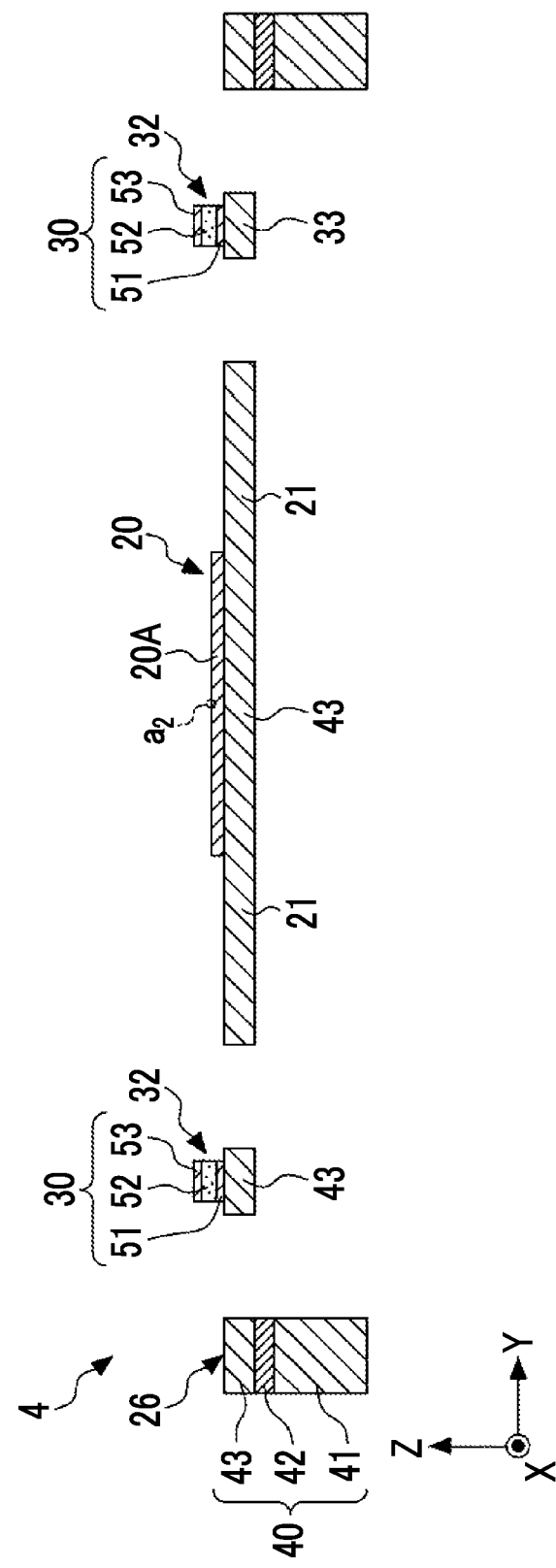
FIG. 5 is a cross-sectional view taken along the line B-B of FIG. 3.
Figure 6:
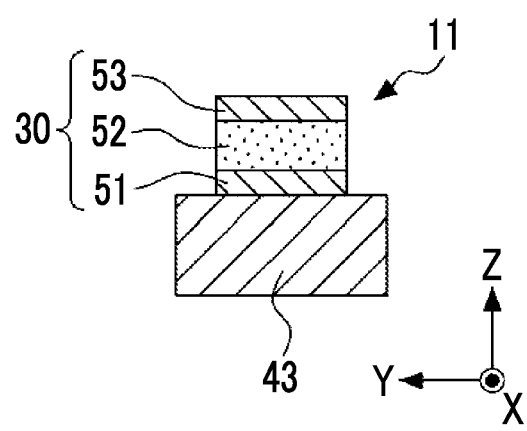
FIG. 6 is a cross-sectional view taken along the line C-C of FIG. 3.

Next, an example of the MMD 4 will be described with reference to FIGS. 2 to 6. FIG. 2 is an external perspective view of the MMD 4. FIG. 3 is a plan view of the MMD 4 as viewed from the light incident side. FIG. 4 is a cross-sectional view taken along the line A-A in FIG. 3. FIG. 5 is a cross-sectional view taken along the line B-B of FIG. 3. FIG. 6 is a cross-sectional view taken along the line C-C of FIG. 3.

As shown in FIGS. 2 and 3, the MMD 4 includes a mirror portion 20, a first support portion 21, a first movable frame 22, a second support portion 23, a second movable frame 24, a connecting portion 25, and a fixed frame 26. The MMD 4 is a so-called MEMS scanner.

The mirror portion 20 has a reflecting surface 20A for reflecting incident light. The reflecting surface 20A is provided on one surface of the mirror portion 20, and is formed of a metal thin film such as gold (Au), aluminum (Al), silver (Ag), or an alloy of silver. The shape of the reflecting surface 20A is, for example, circular with the intersection of the first axis $a_1$ and the second axis $a_2$ as the center.

The first axis $a_1$ and the second axis $a_2$ exist in a plane including the reflecting surface 20A in a case where the mirror portion 20 is stationary. The planar shape of the MMD 4 is rectangular, line-symmetrical with respect to the first axis $a_1$, and line-symmetrical with respect to the second axis $a_2$.

The first support portions 21 are disposed on an outside of the mirror portion 20 at positions facing each other across the second axis $a_2$. The first support portions 21 are connected to the mirror portion 20 on the first axis $a_1$, and swingably support the mirror portion 20 around the first axis $a_1$. In the present embodiment, the first support portion 21 is a torsion bar stretched along the first axis $a_1$.

The first movable frame 22 is a rectangular frame that surrounds the mirror portion 20 and is connected to the mirror portion 20 on the first axis $a_1$ via the first support portion 21. Piezoelectric elements 30 are formed on the first movable frame 22 at positions facing each other across the first axis $a_1$. In this way, a pair of first actuators 31 are configured by forming two piezoelectric elements 30 on the first movable frame 22.

The pair of first actuators 31 are disposed at positions facing each other across the first axis $a_1$. The first actuators 31 allow the mirror portion 20 to swing around the first axis $a_1$ by applying rotational torque around the first axis $a_1$ to the mirror portion 20.

The second support portions 23 are disposed on an outside of the first movable frame 22 at positions facing each other across the first axis $a_1$. The second support portions 23 are connected to the first movable frame 22 on the second axis $a_2$, and swingably support the first movable frame 22 and the mirror portion 20 around the second axis $a_2$. In the present embodiment, the second support portion 23 is a torsion bar stretched along the second axis $a_2$.

The second movable frame 24 is a rectangular frame that surrounds the first movable frame 22 and is connected to the first movable frame 22 on the second axis $a_2$ via the second support portion 23. The piezoelectric elements 30 are formed on the second movable frame 24 at positions facing each other across the second axis $a_2$. In this way, a pair of second actuators 32 are configured by forming two piezoelectric elements 30 on the second movable frame 24.

The pair of second actuators 32 are disposed at positions facing each other across the second axis $a_2$. The second actuators 32 allow the mirror portion 20 to swing around the second axis $a_2$ by applying rotational torque around the second axis $a_2$ to the mirror portion 20 and the first movable frame 22.

The connecting portions 25 are disposed on an outside of the second movable frame 24 at positions facing each other across the first axis $a_1$. The connecting portions 25 are connected to the second movable frame 24 on the second axis $a_2$.

The fixed frame 26 is a rectangular frame that surrounds the second movable frame 24 and is connected to the second movable frame 24 on the second axis $a_2$ via the connecting portion 25.

The first movable frame 22 is provided with a first angle detection sensor 11 in the vicinity of the first support portion 21. The first angle detection sensor 11 is composed of a piezoelectric element. The first angle detection sensor 11 converts a force applied by deformation of the first support portion 21 accompanying the rotation of the mirror portion 20 around the first axis $a_1$ into a voltage and outputs a signal. That is, the first angle detection sensor 11 outputs a signal corresponding to an angle of the mirror portion 20 around the first axis $a_1$.

The second movable frame 24 is provided with a second angle detection sensor 12 in the vicinity of the second support portion 23. The second angle detection sensor 12 is composed of a piezoelectric element. The second angle detection sensor 12 converts a force applied by deformation of the second support portion 23 accompanying the rotation of the mirror portion 20 around the second axis $a_2$ into a voltage and outputs a signal. That is, the second angle detection sensor 12 outputs a signal corresponding to an angle of the mirror portion 20 around the second axis $a_2$.

In FIGS. 2 and 3, the wiring line and the electrode pad for giving the driving signal to the first actuator 31 and the second actuator 32 are not shown. In FIGS. 2 and 3, a wiring line and an electrode pad for outputting signals from the first angle detection sensor 11 and the second angle detection sensor 12 are not shown. A plurality of the electrode pads are provided on the fixed frame 26.

As shown in FIGS. 4 and 5, the MMD 4 is formed, for example, by performing an etching treatment on a silicon on insulator (SOI) substrate 40. The SOI substrate 40 is a substrate in which a silicon oxide layer 42 is provided on a first silicon active layer 41 made of single crystal silicon, and a second silicon active layer 43 made of single crystal silicon is provided on the silicon oxide layer 42.

The mirror portion 20, the first support portion 21, the first movable frame 22, the second support portion 23, the second movable frame 24, and the connecting portion 25 are formed of the second silicon active layer 43 remaining by removing the first silicon active layer 41 and the silicon oxide layer 42 from the SOI substrate 40 by an etching treatment. The second silicon active layer 43 functions as an elastic portion having elasticity. The fixed frame 26 is formed of three layers of the first silicon active layer 41, the silicon oxide layer 42, and the second silicon active layer 43.

The first actuator 31 and the second actuator 32 have the piezoelectric element 30 on the second silicon active layer 43. The piezoelectric element 30 has a laminated structure in which a lower electrode 51, a piezoelectric film 52, and an upper electrode 53 are sequentially laminated on the second silicon active layer 43. An insulating film is provided on the upper electrode 53, but is not shown.

The upper electrode 53 and the lower electrode 51 are formed of, for example, gold (Au) or platinum (Pt). The piezoelectric film 52 is formed of, for example, lead zirconate titanate (PZT), which is a piezoelectric material. The upper electrode 53 and the lower electrode 51 are electrically connected to the driving controller 5 described above via the wiring line and the electrode pad.

A driving voltage is applied to the upper electrode 53 from the driving controller 5. The lower electrode 51 is connected to the driving controller 5 via the wiring line and the electrode pad, and a reference potential (for example, a ground potential) is applied thereto.

In a case where a positive or negative voltage is applied to the piezoelectric film 52 in the polarization direction, deformation (for example, expansion and contraction) proportional to the applied voltage occurs. That is, the piezoelectric film 52 exerts a so-called inverse piezoelectric effect. The piezoelectric film 52 exerts an inverse piezoelectric effect by applying a driving voltage from the driving controller 5 to the upper electrode 53, and displaces the first actuator 31 and the second actuator 32.

As shown in FIG. 6, the first angle detection sensor 11 is also similarly composed of the piezoelectric element 30 consisting of the lower electrode 51, the piezoelectric film 52, and the upper electrode 53 laminated on the second silicon active layer 43. In a case where force (pressure) is applied to the piezoelectric film 52, polarization proportional to the pressure is generated. That is, the piezoelectric film 52 exerts a piezoelectric effect. The piezoelectric film 52 exerts a piezoelectric effect and generates a voltage in a case where force is applied by deformation of the first support portion 21 accompanying the rotation of the mirror portion 20 around the first axis $a_1$.

Since the second angle detection sensor 12 has the same configuration as the first angle detection sensor 11, the second angle detection sensor 12 is not shown.

Figure 7:
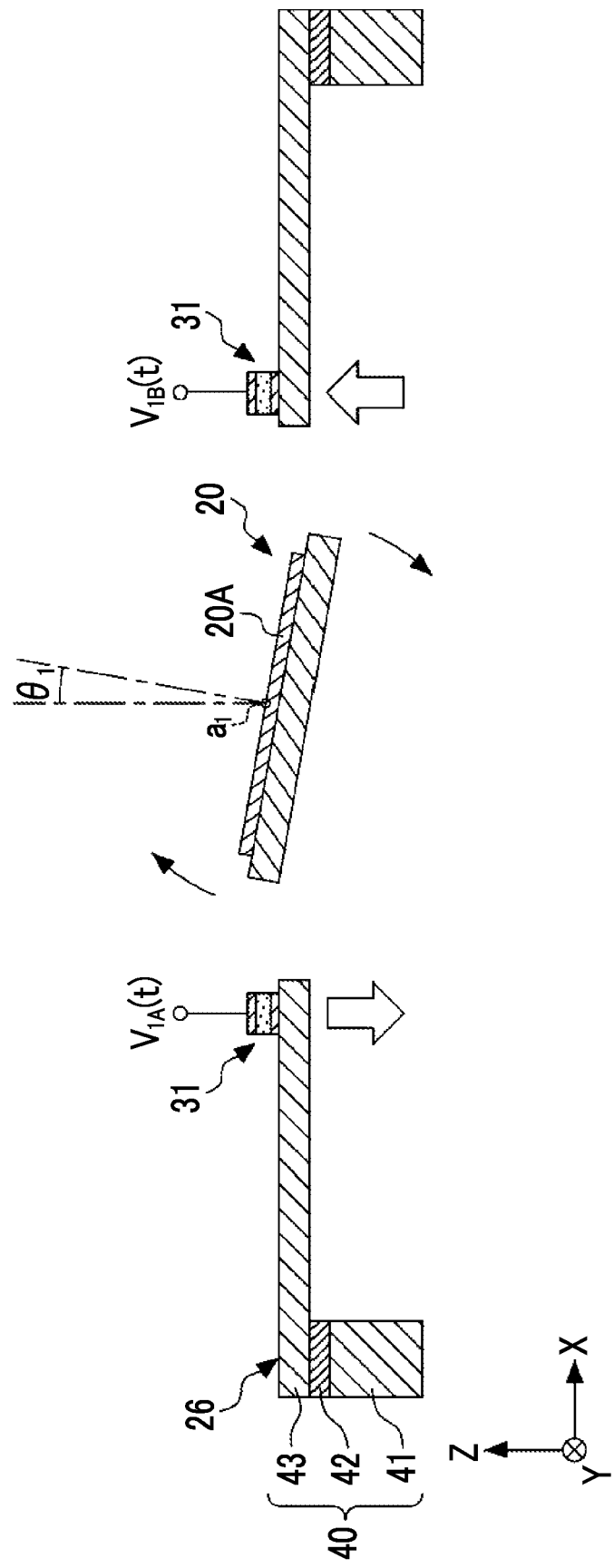
FIG. 7 is a diagram showing an example in which a first actuator is driven.

FIG. 7 shows an example in which one piezoelectric film 52 of the pair of first actuators 31 is extended and the other piezoelectric film 52 is contracted, thereby generating rotational torque around the first axis $a_1$ in the first actuator 31. In this way, one of the pair of first actuators 31 and the other are displaced in opposite directions to each other, whereby the mirror portion 20 rotates around the first axis $a_1$.

In addition, FIG. 7 shows an example in which the first actuator 31 is driven in an anti-phase resonance mode in which the displacement direction of the pair of first actuators 31 and the rotation direction of the mirror portion 20 are opposite to each other. The first actuator 31 may be driven in an in-phase resonance mode in which the displacement direction of the pair of first actuators 31 and the rotation direction of the mirror portion 20 are the same direction.

A deflection angle (hereinafter, referred to as a first deflection angle) $\theta_1$ of the mirror portion 20 around the first axis $a_1$ is controlled by the driving signal (hereinafter, referred to as a first driving signal) given to the first actuator 31 by the driving controller 5. The first driving signal is, for example, a sinusoidal AC voltage. The first driving signal includes a driving voltage waveform $V_{1A}$ (t) applied to one of the pair of first actuators 31 and a driving voltage waveform $V_{1B}$ (t) applied to the other. The driving voltage waveform Via (t) and the driving voltage waveform $V_{1B}$ (t) are in an anti-phase with each other (that is, the phase difference is) 180°.

The first deflection angle $\theta_1$ is an angle at which the normal line of the reflecting surface 20A is inclined with respect to the Z direction in an XZ plane.

Figure 8:
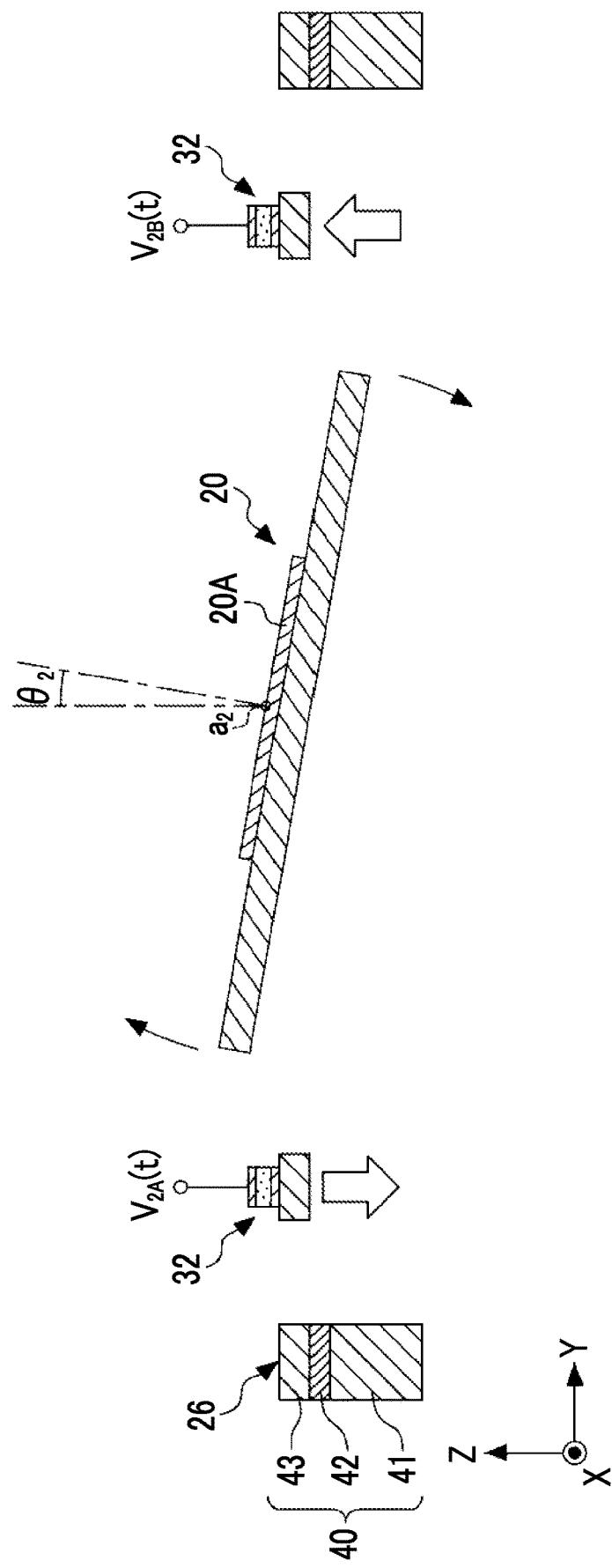
FIG. 8 is a diagram showing an example in which a second actuator is driven.

FIG. 8 shows an example in which one piezoelectric film 52 of the pair of second actuators 32 is extended and the other piezoelectric film 52 is contracted, thereby generating rotational torque around the second axis $a_2$ in the second actuator 32. In this way, one of the pair of second actuators 32 and the other are displaced in opposite directions to each other, whereby the mirror portion 20 rotates around the second axis $a_2$.

In addition, FIG. 8 shows an example in which the second actuator 32 is driven in an anti-phase resonance mode in which the displacement direction of the pair of second actuators 32 and the rotation direction of the mirror portion 20 are opposite to each other. The second actuator 32 may be driven in an in-phase resonance mode in which the displacement direction of the pair of second actuators 32 and the rotation direction of the mirror portion 20 are the same direction.

A deflection angle (hereinafter, referred to as a second deflection angle) $\theta_2$ of the mirror portion 20 around the second axis $a_2$ is controlled by the driving signal (hereinafter, referred to as a second driving signal) given to the second actuator 32 by the driving controller 5. The second driving signal is, for example, a sinusoidal AC voltage. The second driving signal includes a driving voltage waveform $V_{2A}$ (t) applied to one of the pair of second actuators 32 and a driving voltage waveform $V_{2B}$ (t) applied to the other. The driving voltage waveform $V_{2A}$ (t) and the driving voltage waveform $V_{2B}$ (t) are in an anti-phase with each other (that is, the phase difference is 180°).

The second deflection angle $\theta_2$ is an angle at which the normal line of the reflecting surface 20A is inclined with respect to the Z direction in a YZ plane.

Figure 9A:
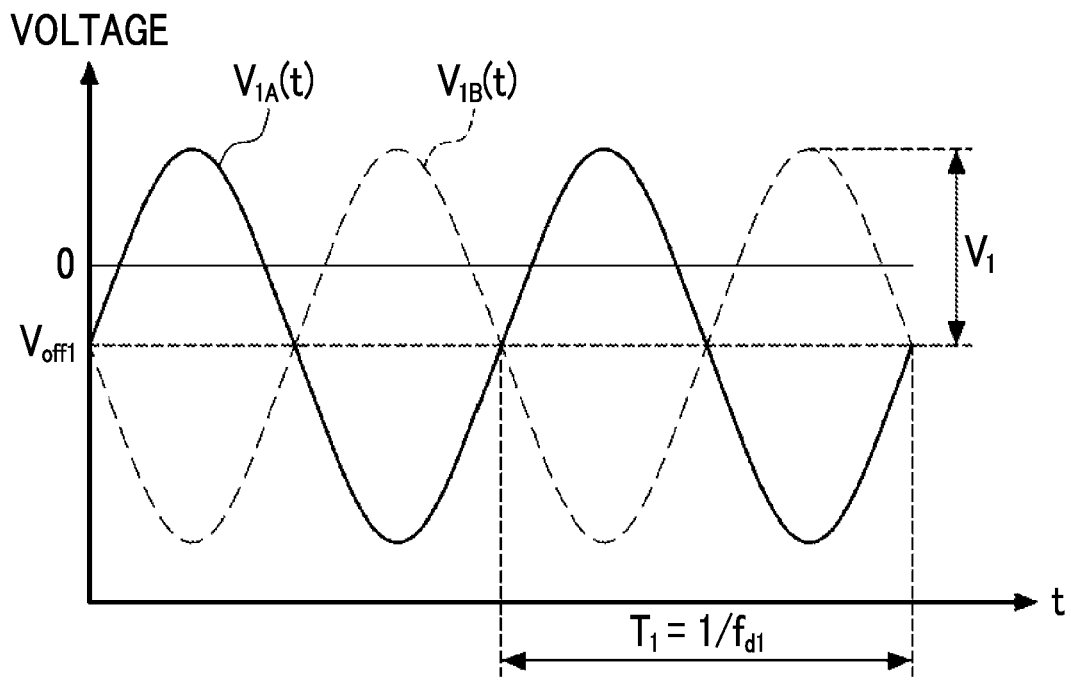
FIGS. 9A and 9B are diagrams showing examples of a first driving signal and a second driving signal.
Figure 9B:
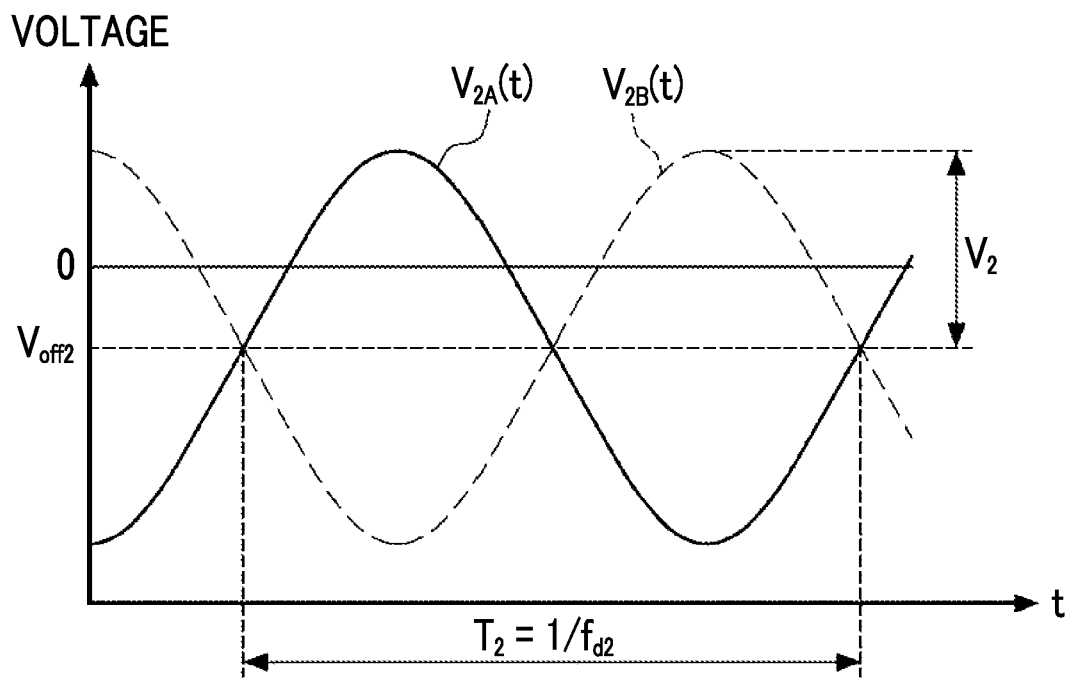

FIGS. 9A and 9B show examples of the first driving signal and the second driving signal. FIG. 9A shows the driving voltage waveforms $V_{1A}$ (t) and $V_{1B}$ (t) included in the first driving signal. FIG. 9B shows the driving voltage waveforms $V_{2A}$ (t) and $V_{2B}$ (t) included in the second driving signal.

The driving voltage waveforms $V_{1A}$ (t) and $V_{1B}$ (t) are represented as follows, respectively.

$$V_{1A}=V_{off1}+V_1 \sin(2\pi f_{d1} t)$$

$$V_{1B}=V_{off1}+V_1 \sin(2\pi f_{d1} t+\alpha)$$

Here, $V_1$ is the amplitude voltage. $V_{off1}$ is the bias voltage. $f_{d1}$ is the driving frequency (hereinafter, referred to as the first driving frequency). t is time. $\alpha$ is the phase difference between the driving voltage waveforms $V_{1A}$ (t) and $V_{1B}$ (t). In the present embodiment, for example, $\alpha=180°$.

By applying the driving voltage waveforms $V_{1A}$ (t) and $V_{1B}$ (t) to the pair of first actuators 31, the mirror portion 20 swings around the first axis $a_1$ at the first driving frequency $f_{d1}$ (see FIG. 7).

The driving voltage waveforms $V_{2A}$ (t) and $V_{2B}$ (t) are represented as follows, respectively.

$$V_{2A}=V_{off2}+V_2 \sin(2\pi f_{d2} t+\varphi)$$

$$V_{2B}=V_{off2}+V_2 \sin(2\pi f_{d2} t+\beta+\varphi)$$

Here, $V_2$ is the amplitude voltage. $V_{off2}$ is the bias voltage. $f_{d2}$ is the driving frequency (hereinafter, referred to as the second driving frequency). t is time. $\beta$ is the phase difference between the driving voltage waveforms $V_{2A}$ (t) and $V_{2B}$ (t). In the present embodiment, for example, $\beta=180°$. In addition, $\varphi$ is the phase difference between the driving voltage waveforms $V_{1A}$ (t) and $V_{1B}$ (t) and the driving voltage waveforms $V_{2A}$ (t) and $V_{2B}$ (t). In the present embodiment, for example, $V_{off1}=V_{off2}=0$ V.

By applying the driving voltage waveforms $V_{2A}$ (t) and $V_{2B}$ (t) to the pair of second actuators 32, the mirror portion 20 swings around the second axis $a_2$ at the second driving frequency $f_{d2}$ (see FIG. 8).

The first driving frequency $f_{d1}$ is set so as to match the resonance frequency around the first axis $a_1$ of the mirror portion 20. The second driving frequency $f_{d2}$ is set so as to match the resonance frequency around the second axis $a_2$ of the mirror portion 20. In the present embodiment, $f_{d1}>f_{d2}$. That is, in the mirror portion 20, a swing frequency around the first axis $a_1$ is higher than a swing frequency around the second axis $a_2$. The first driving frequency $f_{d1}$ and the second driving frequency $f_{d2}$ do not necessarily have to match the resonance frequency. For example, the first driving frequency $f_{d1}$ and the second driving frequency $f_{d2}$ may be frequencies within a frequency range in the vicinity of the resonance frequency, respectively. This frequency range may be, for example, a range of a half-width of frequency distribution having a resonance frequency as a peak value, or may be, for example, within a range of a so-called Q value.

Figure 10:
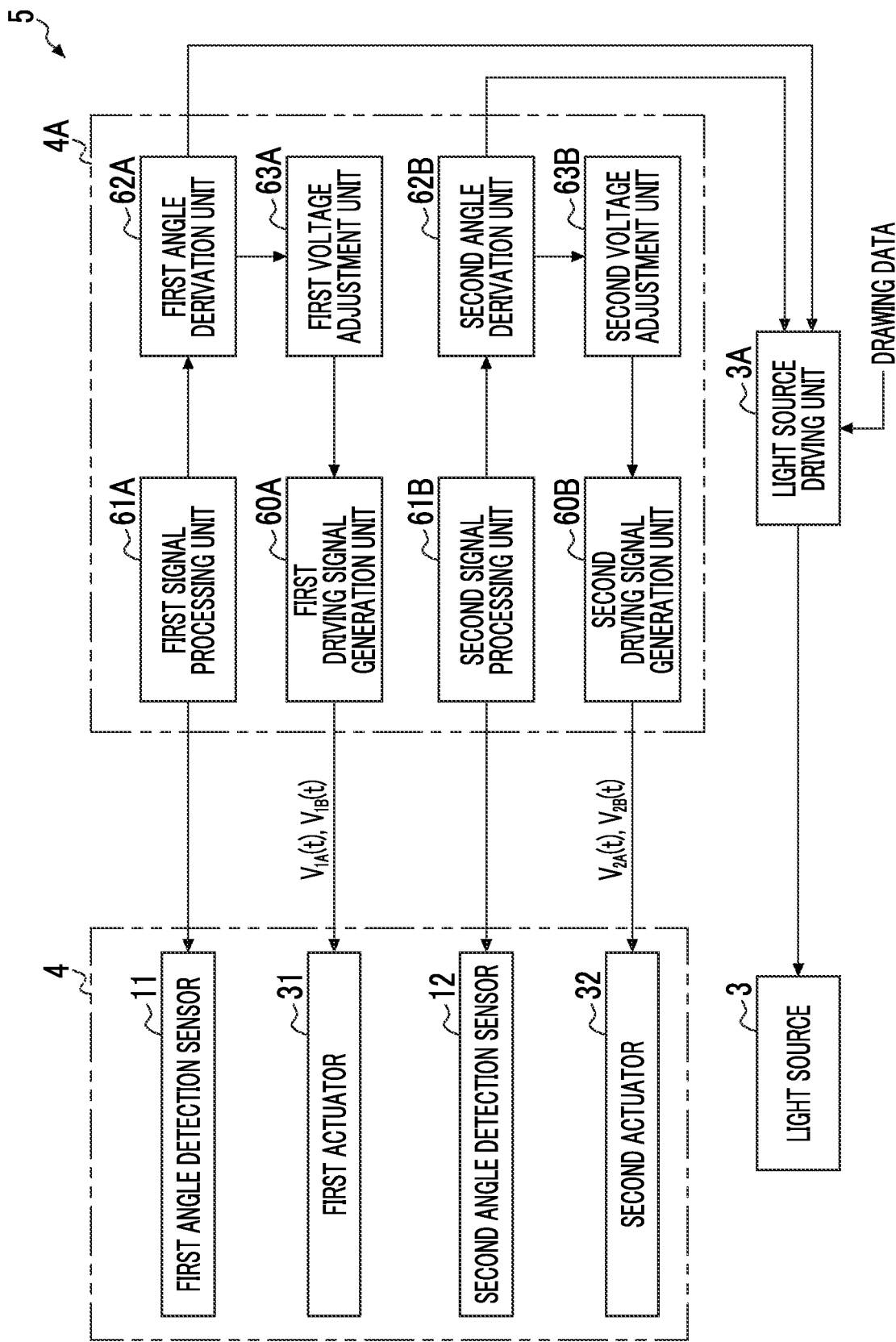
FIG. 10 is a block diagram showing an example of a configuration of a driving controller.

FIG. 10 shows an example of a configuration of the driving controller 5. The driving controller 5 includes a mirror driving unit 4A and a light source driving unit 3A. The mirror driving unit 4A includes a first driving signal generation unit 60A, a first signal processing unit 61A, a first angle derivation unit 62A, a first voltage adjustment unit 63A, a second driving signal generation unit 60B, a second signal processing unit 61B, a second angle derivation unit 62B, and a second voltage adjustment unit 63B.

The first driving signal generation unit 60A, the first signal processing unit 61A, the first angle derivation unit 62A, and the first voltage adjustment unit 63A control a first deflection angle $\theta_1$ of the mirror portion 20. The second driving signal generation unit 60B, the second signal processing unit 61B, the second angle derivation unit 62B, and the second voltage adjustment unit 63B control a second deflection angle $\theta_2$ of the mirror portion 20.

The first driving signal generation unit 60A generates the first driving signal including the above-described driving voltage waveforms $V_{1A}$ (t) and $V_{1B}$ (t) based on a reference waveform, and applies the generated first driving signal to the pair of first actuators 31. Thereby, the mirror portion 20 swings around the first axis $a_1$. The first angle detection sensor 11 outputs a signal S1 corresponding to an angle of the mirror portion 20 around the first axis $a_1$.

The second driving signal generation unit 60B generates the second driving signal including the above-described driving voltage waveforms $V_{2A}$ (t) and $V_{2B}$ (t) based on a reference waveform, and applies the generated second driving signal to the pair of second actuators 32. Thereby, the mirror portion 20 swings around the second axis $a_2$. The second angle detection sensor 12 outputs a signal S2 corresponding to an angle of the mirror portion 20 around the second axis $a_2$.

The first driving signal generated by the first driving signal generation unit 60A and the second driving signal generated by the second driving signal generation unit 60B are phase-synchronized.

FIG. 11 shows an example of a signal output from the first angle detection sensor 11. In FIG. 11, S1$a$ represents a signal output from the first angle detection sensor 11 in a case where the mirror portion 20 swings only around the first axis $a_1$ without swinging around the second axis $a_2$. The signal S1$a$ is a waveform signal similar to a sinusoidal wave having the first driving frequency $f_{d1}$.

In a case where the mirror portion 20 swings around the first axis $a_1$ and the second axis $a_2$ simultaneously, a vibration noise RN1 caused by the swing of the mirror portion 20 around the second axis $a_2$ is superimposed on the output signal of the first angle detection sensor 11. The vibration noise RN1 has the second driving frequency $f_{d2}$. S1$b$ represents a signal in which the vibration noise RN1 is superimposed on the signal S1$a$. For the purpose of the description of this embodiment, the vibration noise RN1 is emphasized.

As described above, in a case of the biaxial drive, the signal S1$b$ on which the vibration noise RN1 is superimposed is output from the first angle detection sensor 11, and an amplitude of the signal S1$b$ fluctuates every cycle. Therefore, it is difficult to directly obtain the deflection angle based on the signal S1$b$ output from the first angle detection sensor 11.

FIG. 12 shows an example of a signal output from the second angle detection sensor 12. In FIG. 12, S2a represents a signal output from the second angle detection sensor 12 in a case where the mirror portion 20 swings only around the second axis $a_2$ without swinging around the first axis $a_1$. The signal S2a is a waveform signal similar to a sinusoidal wave having the second driving frequency $f_{d2}$.

In a case where the mirror portion 20 swings around the first axis $a_1$ and the second axis $a_2$ simultaneously, a vibration noise RN2 caused by the swing of the mirror portion 20 around the first axis $a_1$ is superimposed on the output signal of the second angle detection sensor 12. The vibration noise RN2 has the first driving frequency $f_{d1}$. S2b represents a signal in which the vibration noise RN2 is superimposed on the signal S2a. For the purpose of the description of this embodiment, the vibration noise RN2 is emphasized.

As described above, in a case of the biaxial drive, the signal S2b on which the vibration noise RN2 is superimposed is output from the second angle detection sensor 12, and an amplitude of the signal S2b fluctuates every cycle. Therefore, it is difficult to directly obtain the deflection angle based on the signal S2b output from the second angle detection sensor 12.

Figure 13:
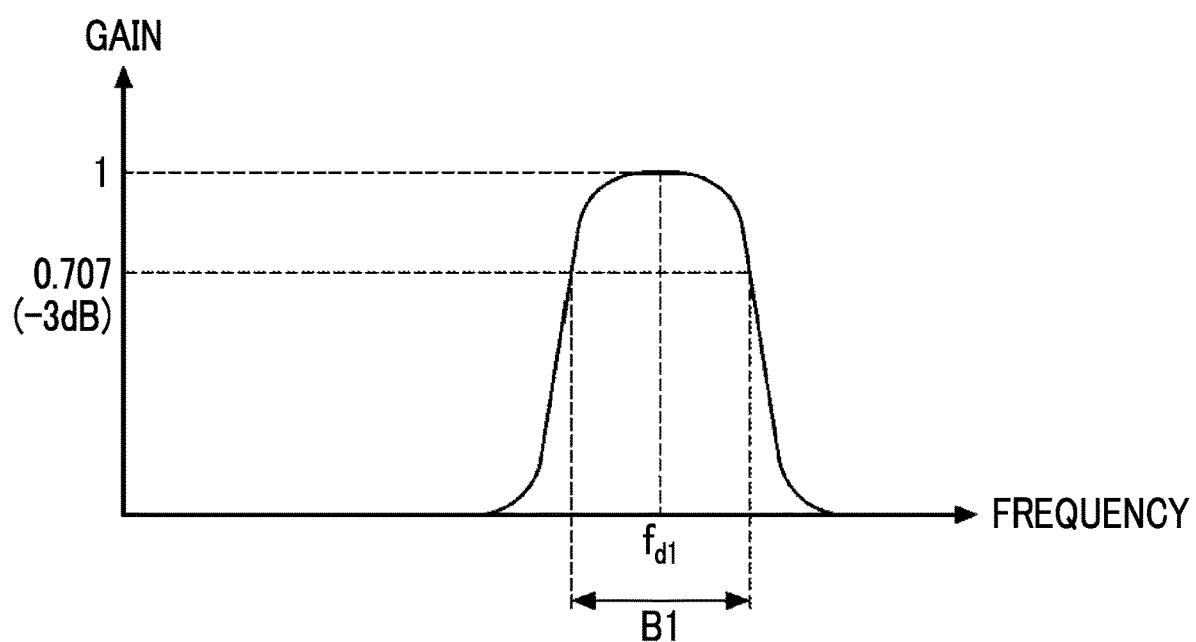
FIG. 13 is a diagram showing characteristics of a first frequency filter.

The first signal processing unit 61A performs the first frequency filter processing based on the first driving frequency $f_{d1}$ on the signal S1b output from the first angle detection sensor 11. For example, the first signal processing unit 61A is a band pass filter circuit having the frequency characteristics shown in FIG. 13. As shown in FIG. 13, the first signal processing unit 61A has a pass band B1 having the first driving frequency $f_{d1}$ as a center frequency. The pass band B1 is, for example, a frequency band of $f_{d1} \pm 5$ kHz. Since the vibration noise RN1 has a frequency outside the pass band B1 (second driving frequency $f_{d2}$), the vibration noise RN1 is removed by the first frequency filter processing. The pass band B1 is an example of a first frequency band according to the technique of the present disclosure.

The first signal processing unit 61A extracts only the signal component included in the pass band B1 from the signal S1b, and outputs the extracted frequency component as a first angle detection signal S1c. FIG. 14 shows a state in which the first angle detection signal S1c is generated from the signal S1b by the first frequency filter processing. The first angle detection signal Sic is a signal obtained by removing the vibration noise RN1 from the signal S1b, and corresponds to the signal S1a shown in FIG. 11.

Figure 15:
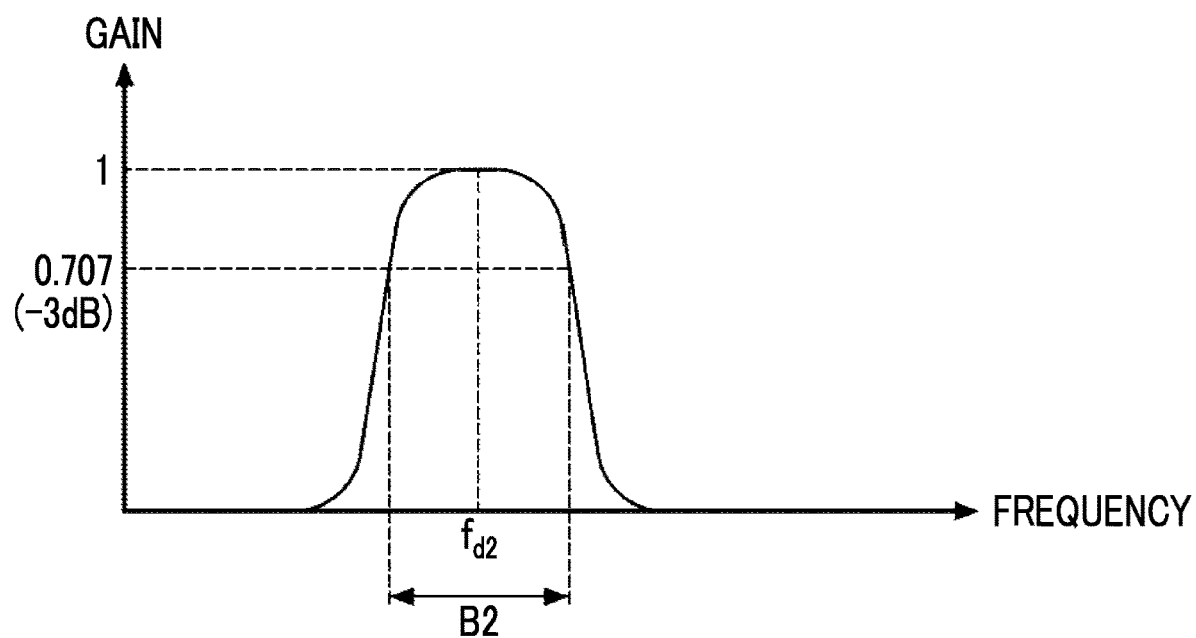
FIG. 15 is a diagram showing characteristics of a second frequency filter.

The second signal processing unit 61B performs the second frequency filter processing based on the second driving frequency $f_{d2}$ on the signal S2b output from the second angle detection sensor 12. For example, the second signal processing unit 61B is a band pass filter circuit having the frequency characteristics shown in FIG. 15. As shown in FIG. 15, the second signal processing unit 61B has a pass band B2 having the second driving frequency $f_{d2}$ as a center frequency. The pass band B2 is, for example, a frequency band of $f_{d2} \pm 5$ kHz. Since the vibration noise RN2 has a frequency outside the pass band B2 (first driving frequency $f_{d1}$), the vibration noise RN2 is removed by the second frequency filter processing. The pass band B2 is an example of a second frequency band according to the technique of the present disclosure.

The second signal processing unit 61B extracts only the signal component included in the pass band B2 from the signal S2b, and outputs the extracted frequency component as a second angle detection signal S2c. FIG. 16 shows a state in which the second angle detection signal S2c is generated from the signal S2b by the second frequency filter processing. The second angle detection signal S2c is a signal obtained by removing the vibration noise RN2 from the signal S2b, and corresponds to the signal S2a shown in FIG. 12.

Figure 17:
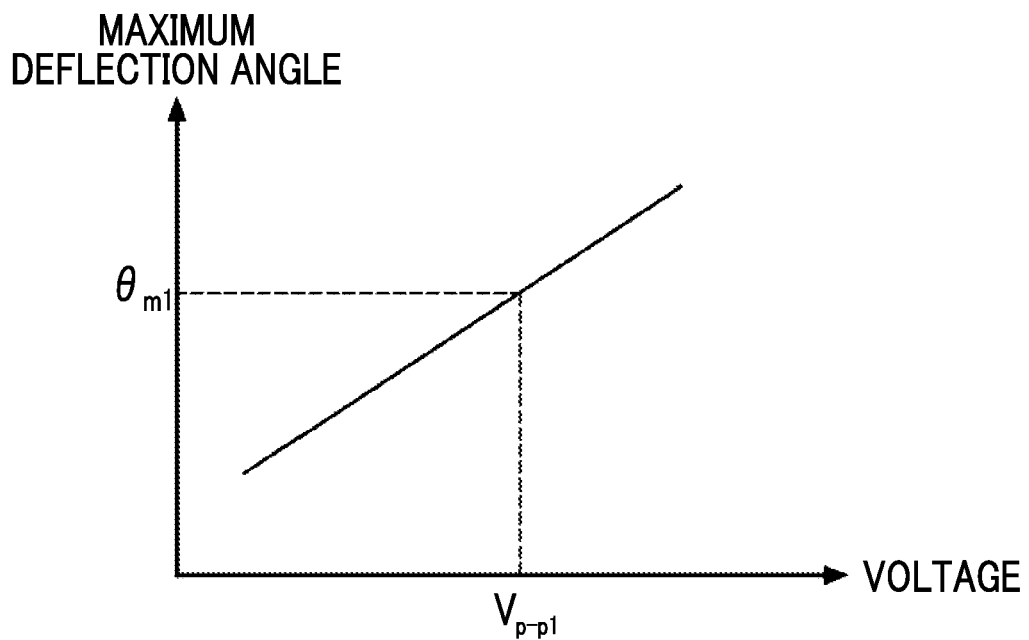
FIG. 17 is a graph showing an example of data showing a relationship between a first maximum deflection angle and a P-P value.

The first angle derivation unit 62A obtains a first angle, which is an angle of the mirror portion 20 around the first axis $a_1$, based on the first angle detection signal S1c. Specifically, the first angle derivation unit 62A obtains a peak to peak (P-P) value $V_{p-p1}$ corresponding to an amplitude of the first angle detection signal S1c (see FIG. 14). The first angle derivation unit 62A holds data showing a relationship between the maximum value (hereinafter, referred to as the first maximum deflection angle) $\theta_{m1}$ of the first deflection angle $\theta_1$ and the P-P value $V_{p-p1}$ shown in FIG. 17. Based on this data, the first angle derivation unit 62A obtains the first maximum deflection angle $\theta_{m1}$ corresponding to the P-P value $V_{p-p1}$ obtained from the first angle detection signal Sic. In the present embodiment, the first maximum deflection angle $\theta_{m1}$ corresponds to the first angle.

Figure 18:
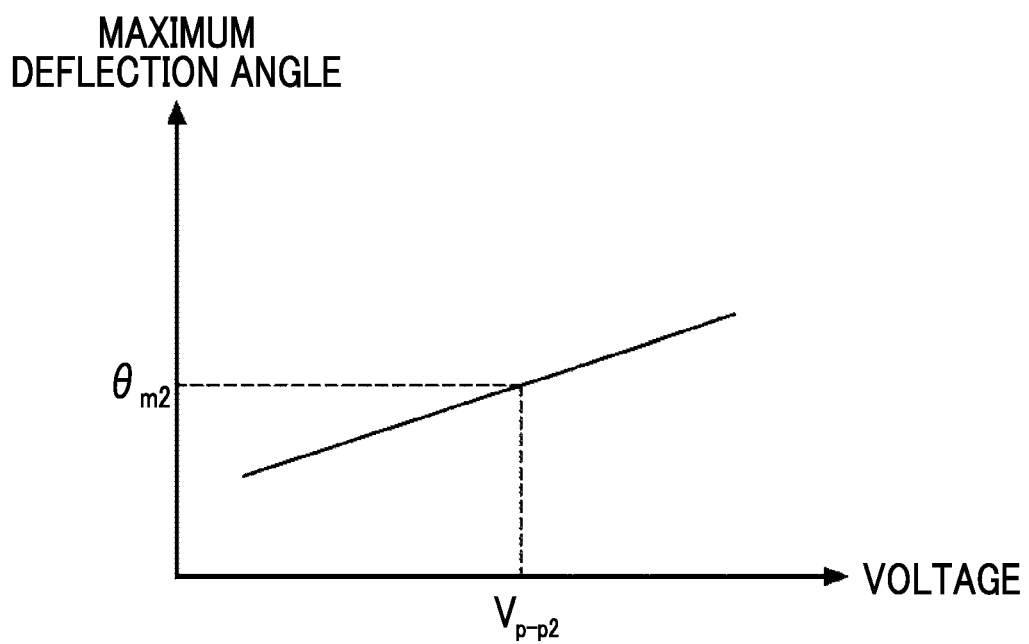
FIG. 18 is a graph showing an example of data showing a relationship between a second maximum deflection angle and a P-P value.

The second angle derivation unit 62B obtains a second angle, which is an angle of the mirror portion 20 around the second axis $a_2$, based on the second angle detection signal S2c. Specifically, the second angle derivation unit 62B obtains a P-P value $V_{p-p2}$ corresponding to an amplitude of the second angle detection signal S2c (see FIG. 16). The second angle derivation unit 62B holds data showing a relationship between the maximum value (hereinafter, referred to as the second maximum deflection angle) $\theta_{m2}$ of the second deflection angle $\theta_2$ and the P-P value $V_{p-p2}$ shown in FIG. 18. Based on this data, the second angle derivation unit 62B obtains the second maximum deflection angle $\theta_{m2}$ corresponding to the P-P value $V_{p-p2}$ obtained from the second angle detection signal S2c. In the present embodiment, the second maximum deflection angle $\theta_{m2}$ corresponds to the second angle.

The first voltage adjustment unit 63A adjusts a voltage value of the first driving signal generated by the first driving signal generation unit 60A based on the first angle derived by the first angle derivation unit 62A. Specifically, the first voltage adjustment unit 63A adjusts amplitude voltages $V_1$ of the driving voltage waveforms $V_{1A}$ (t) and $V_{1B}$ (t) included in the first driving signal, based on the first maximum deflection angle $\theta_{m1}$ derived by the first angle derivation unit 62A.

Figure 19:
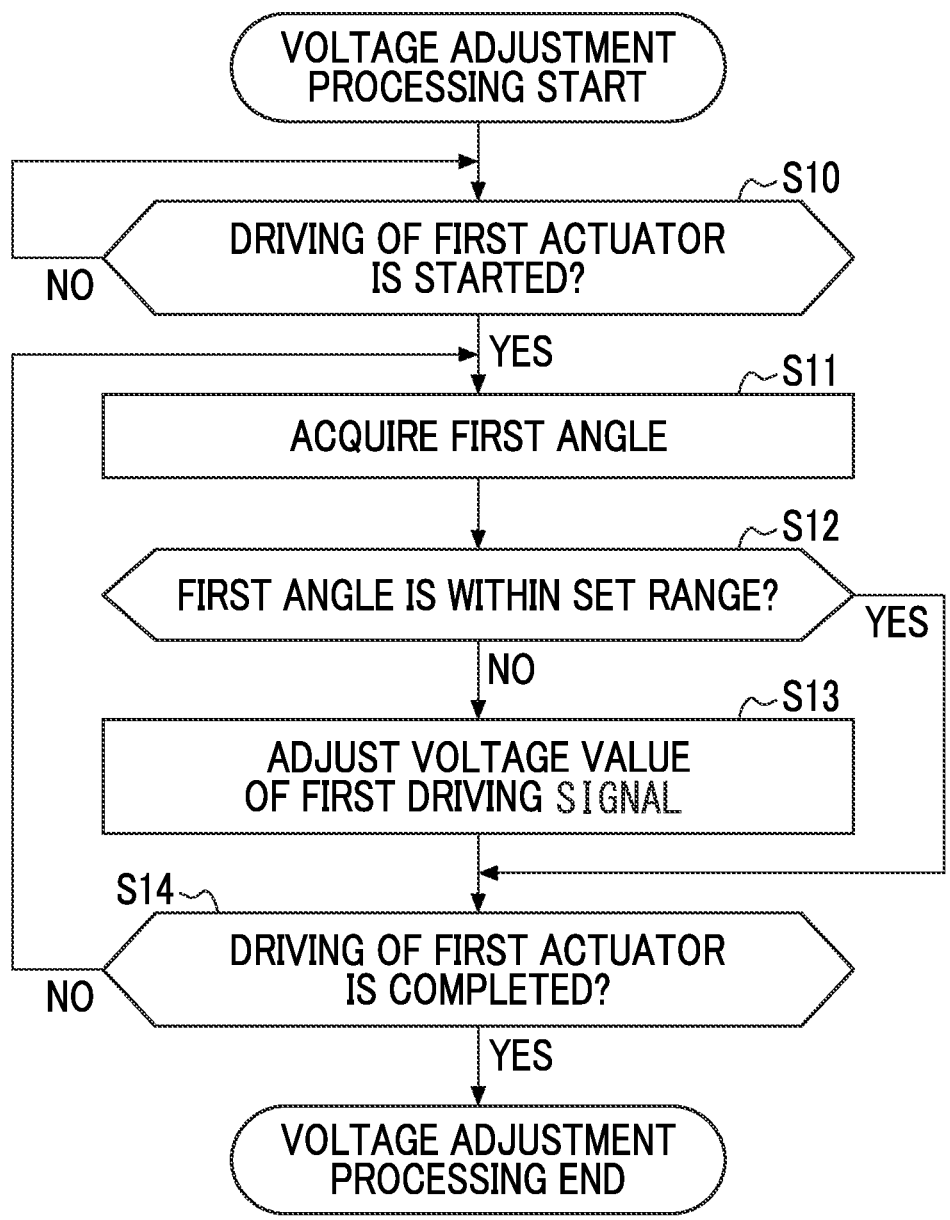
FIG. 19 is a flowchart showing an example of voltage adjustment processing by a first voltage adjustment unit.

FIG. 19 shows an example of voltage adjustment processing by the first voltage adjustment unit 63A. As shown in FIG. 19, first, the first voltage adjustment unit 63A determines whether or not the driving of the first actuator 31 has started by outputting the first driving signal from the first driving signal generation unit 60A (Step S10).

In a case where it is determined that the driving of the first actuator 31 has started (Step S10: YES), the first voltage adjustment unit 63A starts the operation. In a case where the first voltage adjustment unit 63A acquires the first maximum deflection angle $\theta_{m1}$ as the first angle from the first angle derivation unit 62A (Step S11), the first voltage adjustment unit 63A determines whether or not the first maximum deflection angle $\theta_{m1}$ is within a predetermined set range (Step S12). The set range of Step S12 is an example of a first condition according to the technique of the present disclosure. That is, in Step S12, it is determined whether or not the first angle satisfies the first condition.

In a case where the first maximum deflection angle $\theta_{m1}$ is out of the set range (Step S12: NO), the first voltage adjustment unit 63A adjusts the amplitude voltage $V_1$ of the first driving signal (Step S13). For example, the first voltage adjustment unit 63A lowers the amplitude voltage $V_1$ in a case where the first maximum deflection angle $\theta_{m1}$ exceeds an upper limit value of the set range, and raises the amplitude voltage $V_1$ in a case where the first maximum deflection angle $\theta_{m1}$ falls below a lower limit value of the set range.

In a case where the first maximum deflection angle $\theta_{m1}$ is within the set range (Step S12: YES), the first voltage adjustment unit 63A skips Step S13 and shifts the process to Step S14.

In Step S14, the first voltage adjustment unit 63A determines whether or not the driving of the first actuator 31 has been completed (Step S14). In a case where it is determined that the driving of the first actuator 31 has not been completed (Step S14: NO), the first voltage adjustment unit 63A returns the process to Step S11. In Step S11, the first voltage adjustment unit 63A acquires the first maximum deflection angle $\theta_{m1}$ again from the first angle derivation unit 62A.

As described above, the first voltage adjustment unit 63A repeatedly executes Steps S11 to S13 until it is determined in Step S14 that the driving of the first actuator 31 has been completed. In a case where it is determined that the driving of the first actuator 31 has been completed (Step S14: YES), the first voltage adjustment unit 63A ends the voltage adjustment processing.

The first angle derivation unit 62A executes a process of deriving the first maximum deflection angle $\theta_{m1}$ as the first angle for each predetermined cycle.

The second voltage adjustment unit 63B adjusts a voltage value of the second driving signal generated by the second driving signal generation unit 60B based on the second angle derived by the second angle derivation unit 62B. Specifically, the second voltage adjustment unit 63B adjusts amplitude voltages $V_2$ of the driving voltage waveforms $V_{2A}$ (t) and $V_{2B}$ (t) included in the second driving signal, based on the second maximum deflection angle $\theta_{m2}$ derived by the second angle derivation unit 62B.

Figure 20:
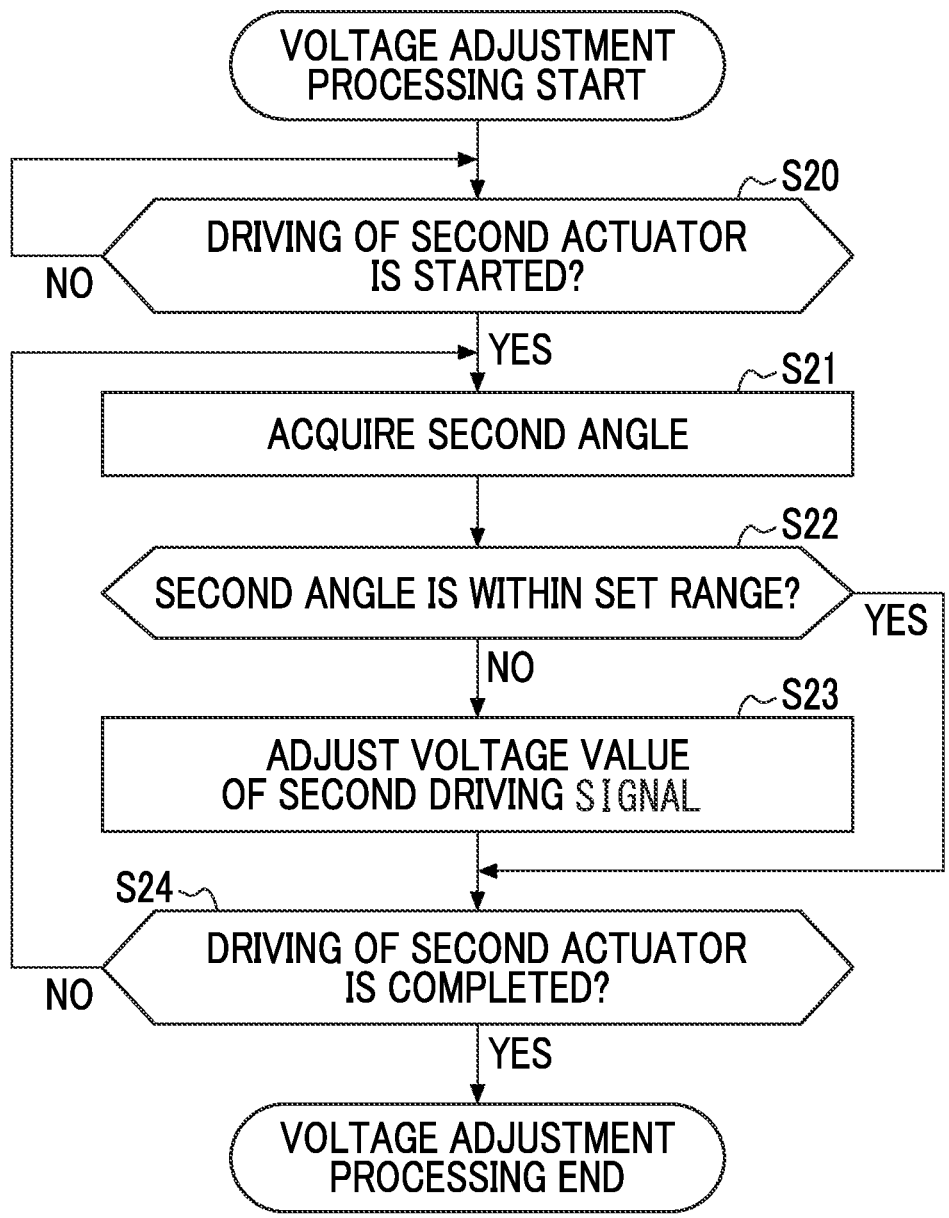
FIG. 20 is a flowchart showing an example of voltage adjustment processing by a second voltage adjustment unit.

FIG. 20 shows an example of voltage adjustment processing by the second voltage adjustment unit 63B. Each process of Steps S20 to S24 shown in FIG. 20 is the same as each process of Steps S10 to S14 shown in FIG. 19. Since the voltage adjustment processing by the second voltage adjustment unit 63B is the same as the voltage adjustment processing by the first voltage adjustment unit 63A, detailed description thereof is not shown. The set range of Step S22 is an example of a second condition according to the technique of the present disclosure. That is, in Step S22, it is determined whether or not the second angle satisfies the second condition.

The second angle derivation unit 62B executes a process of deriving the second maximum deflection angle $\theta_{m2}$ as the second angle for each predetermined cycle.

Returning to FIG. 10, the light source driving unit 3A drives the light source 3 based on drawing data supplied from the outside of the image drawing system 10, for example. The light source driving unit 3A controls the irradiation timing of the laser light of the light source 3 based on the drawing data. The light source driving unit 3A may adjust the irradiation timing based on the first angle and the second angle derived by the first angle derivation unit 62A and the second angle derivation unit 62B.

As described above, according to the technique of the present disclosure, the first angle detection signal is generated by performing the first frequency filter processing on the output signal of the first angle detection sensor, and the second angle detection signal is generated by performing the second frequency filter processing on the output signal of the second angle detection sensor. The vibration noise is removed by the first frequency filter processing and the second frequency filter processing, and the first angle and the second angle are obtained accurately. Therefore, the deflection angle of the mirror portion can be accurately controlled.

Modification Example

Next, a modification example of the first embodiment will be described. In the first embodiment, although the first frequency filter processing and the second frequency filter processing are band pass filter processing, the first frequency filter processing and the second frequency filter processing are not limited to the band pass filter processing. For example, the first frequency filter processing may be high-pass filter processing having a cutoff frequency between the first driving frequency $f_{d1}$ and the second driving frequency $f_{d2}$. In addition, the second frequency filter processing may be low-pass filter processing having a cutoff frequency between the first driving frequency $f_{d1}$ and the second driving frequency $f_{d2}$.

Figure 21:
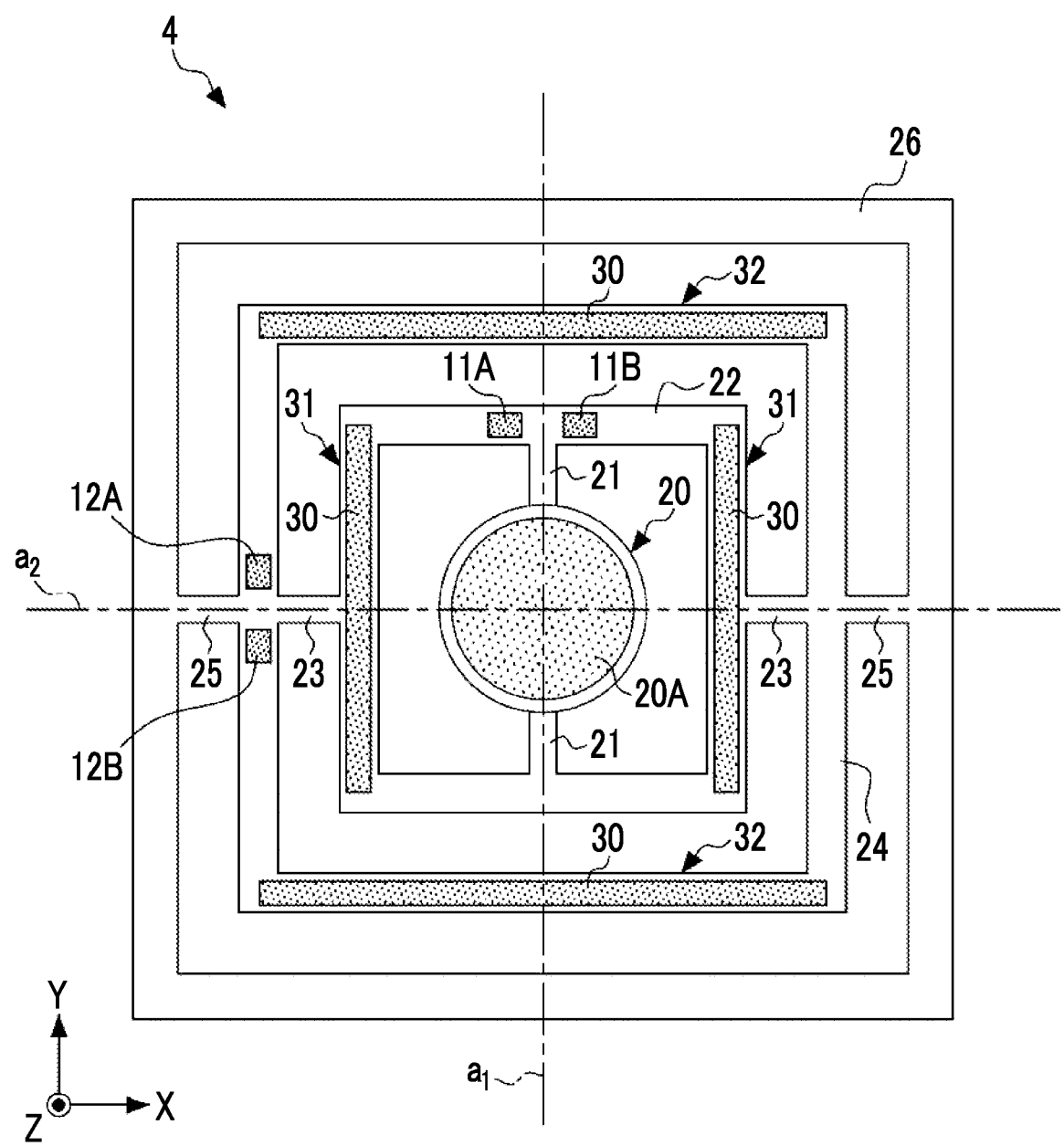
FIG. 21 is a diagram showing a modification example of a micromirror device related to an angle detection sensor.

In the first embodiment, as shown in FIG. 3, one first angle detection sensor 11 is provided for the first axis $a_1$, and one second angle detection sensor 12 is provided for the second axis $a_2$. On the other hand, as shown in FIG. 21, the pair of first angle detection sensors 11A and 11B may be provided at positions facing each other across the first axis $a_1$, and the pair of second angle detection sensors 12A and 12B may be provided at positions facing each other across the second axis $a_2$.

Figure 22:
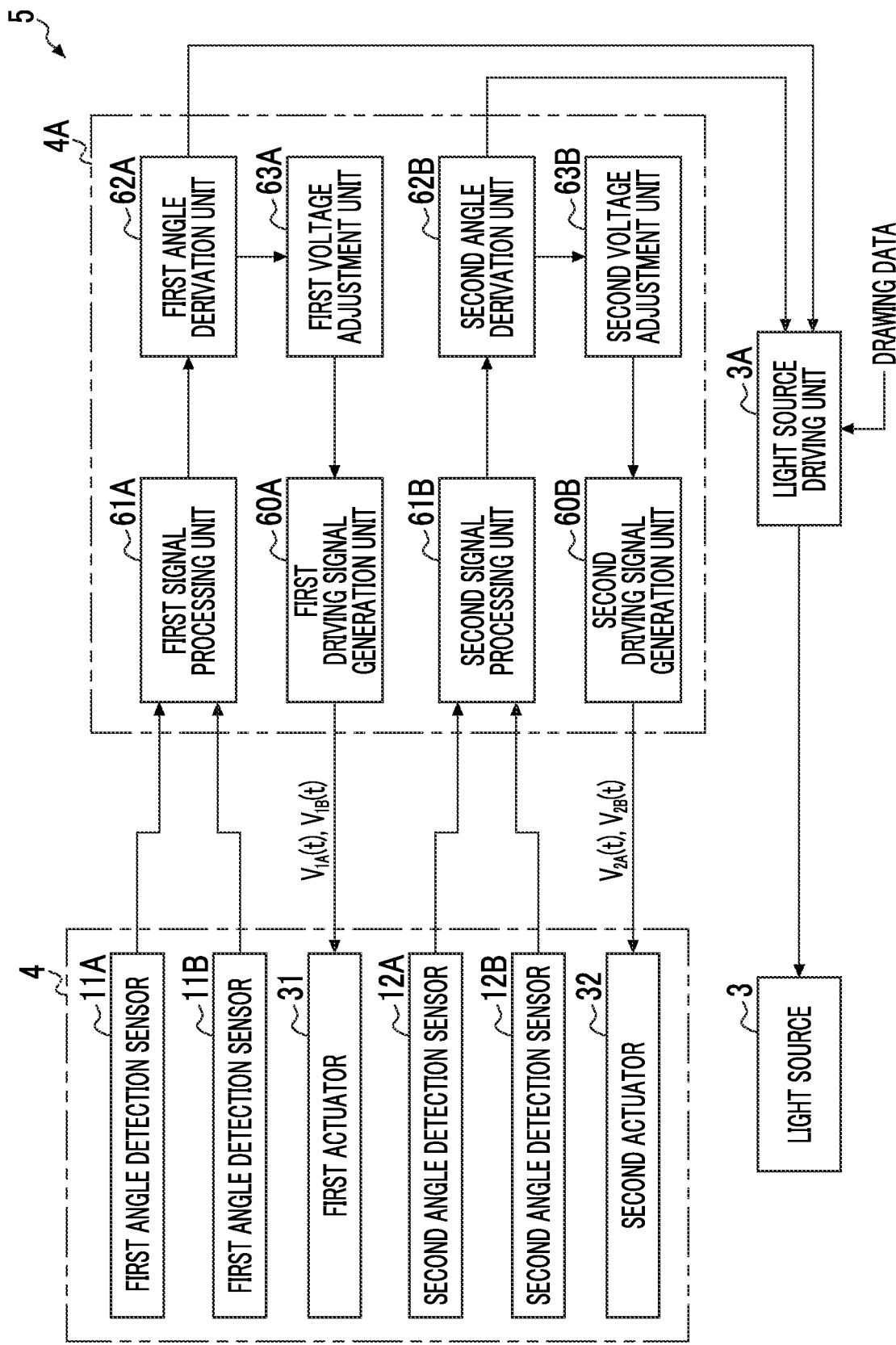
FIG. 22 is a block diagram showing an example of a configuration of a driving controller according to a modification example.

In this case, as shown in FIG. 22, the output signals of the pair of first angle detection sensors 11A and 11B are input to the first signal processing unit 61A, respectively. The output signals of the pair of second angle detection sensors 12A and 12B are input to the second signal processing unit 61B, respectively.

FIG. 23 shows an example of signals output from the pair of first angle detection sensors 11A and 11B. In FIG. 23, $S1a_1$ and $S1a_2$ represent signals output from the pair of first angle detection sensors 11A and 11B in a case where the mirror portion 20 swings only around the first axis $a_1$ without swinging around the second axis $a_2$. The signals $S1a_1$ and $S1a_2$ are waveform signals similar to a sinusoidal wave having the first driving frequency $f_{d1}$ and are in an anti-phase with each other.

In a case where the mirror portion 20 swings around the first axis $a_1$ and the second axis $a_2$ simultaneously, a vibration noise RN1 caused by the swing of the mirror portion 20 around the second axis $a_2$ is superimposed on the output signals of the pair of first angle detection sensors 11A and 11B. $S1b_1$ represents a signal in which the vibration noise RN1 is superimposed on the signal $S1a_1$. $S1b_2$ represents a signal in which the vibration noise RN1 is superimposed on the signal $S1a_2$.

FIG. 24 shows an example of signals output from the pair of second angle detection sensors 12A and 12B. In FIG. 24, $S2a_1$ and $S2a2$ represent signals output from the pair of second angle detection sensors 12A and 12B in a case where the mirror portion 20 swings only around the second axis $a_2$ without swinging around the first axis $a_1$. The signals $S2a_1$ and $S2a_2$ are waveform signals similar to a sinusoidal wave having the second driving frequency $f_{d2}$ and are in an anti-phase with each other.

In a case where the mirror portion 20 swings around the first axis $a_1$ and the second axis $a_2$ simultaneously, a vibration noise RN2 caused by the swing of the mirror portion 20 around the first axis $a_1$ is superimposed on the output signals of the pair of second angle detection sensors 12A and 12B.

$S2b_1$ represents a signal in which the vibration noise RN2 is superimposed on the signal $S2a_1$. $S2b_2$ represents a signal in which the vibration noise RN2 is superimposed on the signal $S2a_2$.

In the present modification example, the first signal processing unit 61A performs the above-described first frequency filter processing on each of the signals $S1b_1$ and $S1b_2$ output from the pair of first angle detection sensors 11A and 11B. The first angle derivation unit 62A need only derive the above-described first angle based on both or one of the first angle detection signals $S1c_1$ and $S1c_2$ generated by performing the first frequency filter processing on the signals $S1b_1$ and $S1b_2$.

Similarly, the second signal processing unit 61B performs the above-described second frequency filter processing on each of the signals $s2b_1$ and $S2b_2$ output from the pair of second angle detection sensors 12A and 12B. The second angle derivation unit 62B need only derive the above-described second angle based on both or one of the second angle detection signals $S2c_1$ and $S2c_2$ generated by performing the second frequency filter processing on the signals $S2b_1$ and $S2b_2$.

Figure 25:
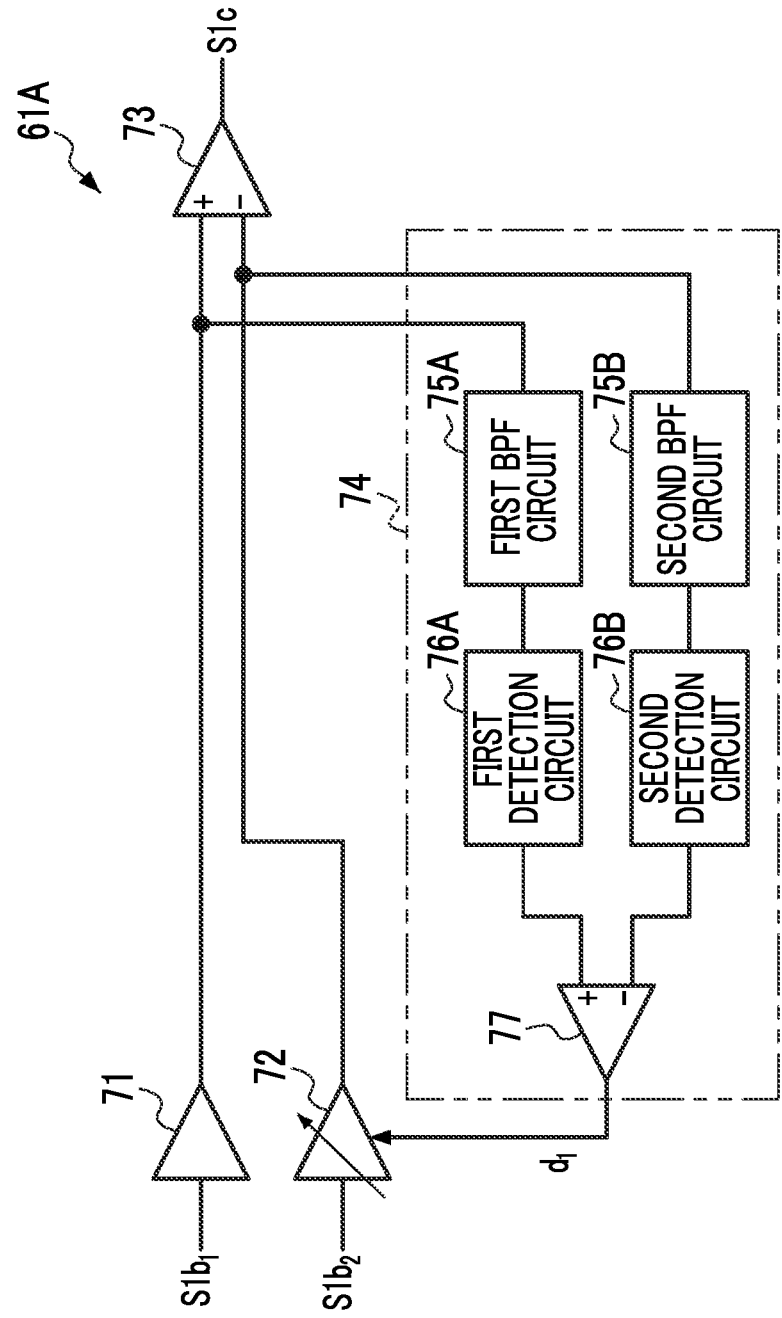
FIG. 25 is a circuit diagram showing a configuration of a first signal processing unit according to the modification example.
Figure 26:
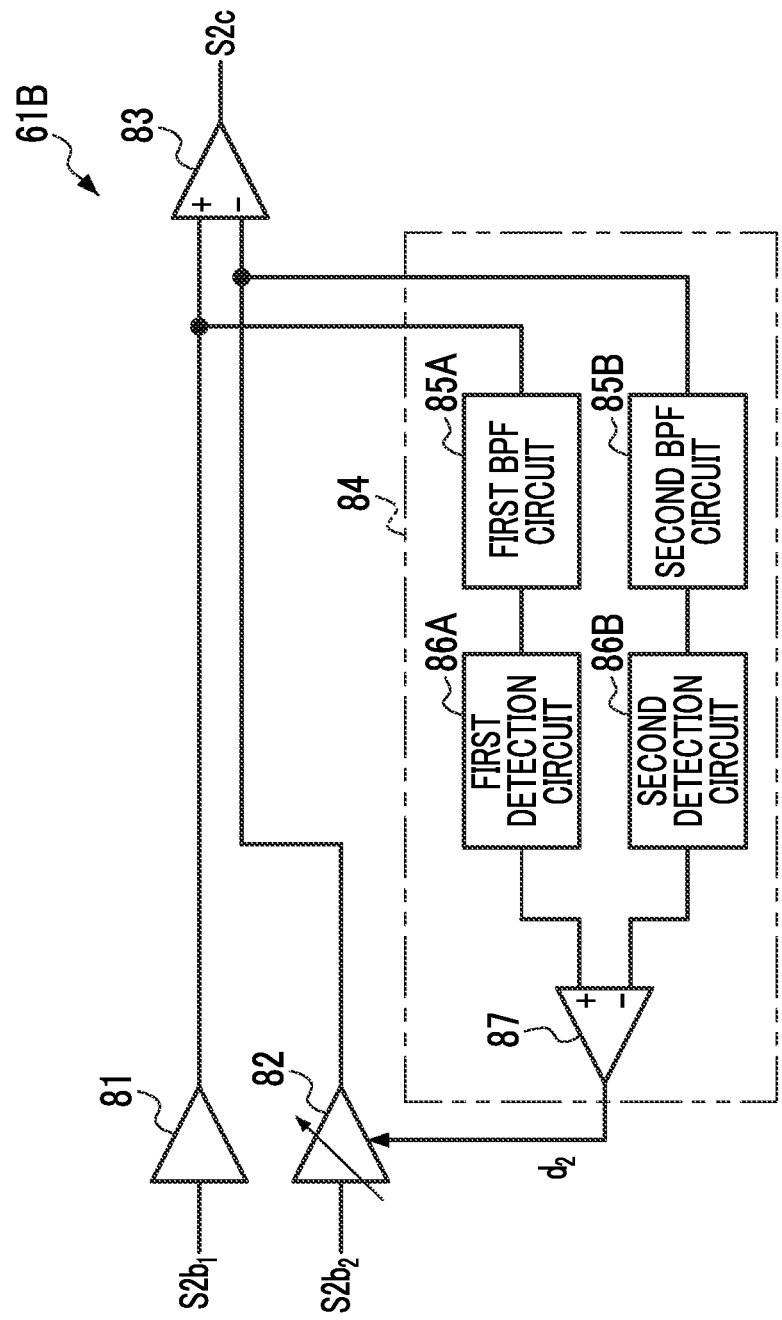
FIG. 26 is a circuit diagram showing a configuration of a second signal processing unit according to the modification example.

Next, a modification example of the first signal processing unit 61A and the second signal processing unit 61B will be described. FIG. 25 shows an example in which the first signal processing unit 61A includes an analog arithmetic circuit. FIG. 26 shows an example in which the second signal processing unit 61B includes an analog arithmetic circuit.

As shown in FIG. 25, the first signal processing unit 61A is composed of a buffer amplifier 71, a variable gain amplifier 72, a subtraction circuit 73, and a gain adjustment circuit 74. The gain adjustment circuit 74 is composed of a first band pass filter (BPF) circuit 75A, a second BPF circuit 75B, a first detection circuit 76A, a second detection circuit 76B, and a subtraction circuit 77. The subtraction circuit 73 and the subtraction circuit 77 are differential amplification circuits including an operational amplifier.

The signal $S1b_1$ output from the first angle detection sensor 11A is input to a positive input terminal (non-inverting input terminal) of the subtraction circuit 73 via the buffer amplifier 71. In addition, the signal output from the buffer amplifier 71 is branched in the middle of the process before being input to the subtraction circuit 73, and is input to the first BPF circuit 75A in the gain adjustment circuit 74.

The signal $S1b_2$ output from the first angle detection sensor 11B is input to a negative input terminal (inverting input terminal) of the subtraction circuit 73 via the variable gain amplifier 72. In addition, the signal output from the variable gain amplifier 72 is branched in the middle of the process before being input to the subtraction circuit 73, and is input to the second BPF circuit 75B in the gain adjustment circuit 74.

Each of the first BPF circuit 75A and the second BPF circuit 75B has a pass band having the second driving frequency $f_{d2}$ as a center frequency. The first BPF circuit 75A and the second BPF circuit 75B are, for example, band pass filter circuits having the frequency characteristics shown in FIG. 15. The first BPF circuit 75A extracts and outputs the vibration noise RN1 (see FIG. 13) from the signal input from the buffer amplifier 71. The second BPF circuit 75B extracts and outputs the vibration noise RN1 (see FIG. 13) from the signal input from the variable gain amplifier 72.

Each of the first detection circuit 76A and the second detection circuit 76B is composed of, for example, a root mean squared value to direct current converter (RMS-DC converter). The first detection circuit 76A converts the amplitude of the vibration noise RN1 input from the first BPF circuit 75A into a DC voltage signal and inputs the signal to the positive input terminal of the subtraction circuit 77. The second detection circuit 76B converts the amplitude of the vibration noise RN1 input from the second BPF circuit 75B into a DC voltage signal and inputs the signal to the negative input terminal of the subtraction circuit 77.

The subtraction circuit 77 outputs a value $d_1$ obtained by subtracting the DC voltage signal input from the second detection circuit 76B from the DC voltage signal input from the first detection circuit 76A. The value $d_1$ corresponds to a difference between the amplitude of the vibration noise RN1 included in the signal $S1b_1$ output from the first angle detection sensor 11A and the amplitude of the vibration noise RN1 included in the signal $S2b_2$ output from the first angle detection sensor 11B. The subtraction circuit 77 inputs the value $d_1$ as a gain adjustment value to a gain adjustment terminal of the variable gain amplifier 72.

The variable gain amplifier 72 adjusts an amplitude of the signal $S2b_2$ by multiplying the signal $S2b_2$ input from the first angle detection sensor 11B by the value $d_1$ input as the gain adjustment value. In this way, a feedback control is performed by the gain adjustment circuit 74, so that the amplitude of the vibration noise RN1 included in the signal $S2b_2$ after passing through the variable gain amplifier 72 is adjusted so as to be equal to the amplitude of the vibration noise RN1 included in the signal $S1b_1$ after passing through the buffer amplifier 71.

The subtraction circuit 73 outputs a value obtained by subtracting the signal $S2b_2$ input to the negative input terminal from the signal $S1b_1$ input to the positive input terminal. Since the amplitudes of the vibration noise RN1 included in both signals are adjusted to be equal to each other by the feedback control, the vibration noise RN1 included in both signals is offset by the subtraction processing by the subtraction circuit 73. Therefore, the subtraction circuit 73 outputs a signal corresponding to the first angle detection signal $S1c$ (see FIG. 14), which is a signal from which the vibration noise RN1 has been removed. The amplitude of the signal output from the subtraction circuit 73 is twice that of the first angle detection signal $S1c$ shown in FIG. 14.

As shown in FIG. 26, the second signal processing unit 61B is composed of a buffer amplifier 81, a variable gain amplifier 82, a subtraction circuit 83, and a gain adjustment circuit 84. The gain adjustment circuit 84 is composed of a first BPF circuit 85A, a second BPF circuit 85B, a first detection circuit 86A, a second detection circuit 86B, and a subtraction circuit 87. The subtraction circuit 83 and the subtraction circuit 87 are differential amplification circuits including an operational amplifier.

The signal $S2b_1$ output from the second angle detection sensor 12A is input to a positive input terminal of the subtraction circuit 83 via the buffer amplifier 81. In addition, the signal output from the buffer amplifier 81 is branched in the middle of the process before being input to the subtraction circuit 83, and is input to the first BPF circuit 85A in the gain adjustment circuit 84.

The signal $S2b_2$ output from the second angle detection sensor 12B is input to a negative input terminal of the subtraction circuit 83 via the variable gain amplifier 82. In addition, the signal output from the variable gain amplifier 82 is branched in the middle of the process before being input to the subtraction circuit 83, and is input to the second BPF circuit 85B in the gain adjustment circuit 84.

The configuration of each circuit in the gain adjustment circuit 84 is the same except that the first BPF circuit 85A and the second BPF circuit 85B each have a pass band having the first driving frequency $f_{d1}$ as a center frequency. That is, the gain adjustment circuit 84 generates a value $d_2$ representing a difference between the amplitude of the vibration noise RN2 included in the signal S2$b_1$ output from the second angle detection sensor 12A and the amplitude of the vibration noise RN2 included in the signal S2$b_2$ output from the second angle detection sensor 12B.

The variable gain amplifier 82 adjusts an amplitude of the signal S2$b_2$ input from the second angle detection sensor 12B based on the value $d_2$ input as the gain adjustment value from the gain adjustment circuit 84. As a result, the subtraction circuit 83 outputs a signal corresponding to the second angle detection signal S2$c$ (see FIG. 16), which is a signal from which the vibration noise RN2 has been removed. The amplitude of the signal output from the subtraction circuit 83 is twice that of the second angle detection signal S2$c$ shown in FIG. 16.

The configuration of the MMD 4 shown in the above embodiment is an example. The configuration of the MMD 4 can be modified in various ways. For example, the first actuator 31 that allows the mirror portion 20 to swing around the first axis $a_1$ may be disposed on the second movable frame 24, and the second actuator 32 that allows the mirror portion 20 to swing around the second axis $a_2$ may be disposed on the first movable frame 22.

The hardware configuration of the driving controller 5 can be variously modified. The processing unit of the driving controller 5 may be composed of one processor or may be composed of a combination of two or more processors of the same type or different types. The processor includes, for example, a central processing unit (CPU), a programmable logic device (PLD), or a dedicated electric circuit. As is well known, the CPU is a general-purpose processor that executes software (program) to function as various processing units. The PLD is a processor such as a field programmable gate array (FPGA) whose circuit configuration can be changed after manufacture. The dedicated electric circuit is a processor that has a dedicated circuit configuration designed to perform a specific process, such as an application specific integrated circuit (ASIC). The processor may be an analog arithmetic circuit or a digital arithmetic circuit.

For example, the gain adjustment circuit 74 (see FIG. 25) in the first signal processing unit 61A and the gain adjustment circuit 84 (see FIG. 26) in the second signal processing unit 61B can include a digital arithmetic circuit such as a microcomputer, a CPU, or an FPGA.

Figure 27:
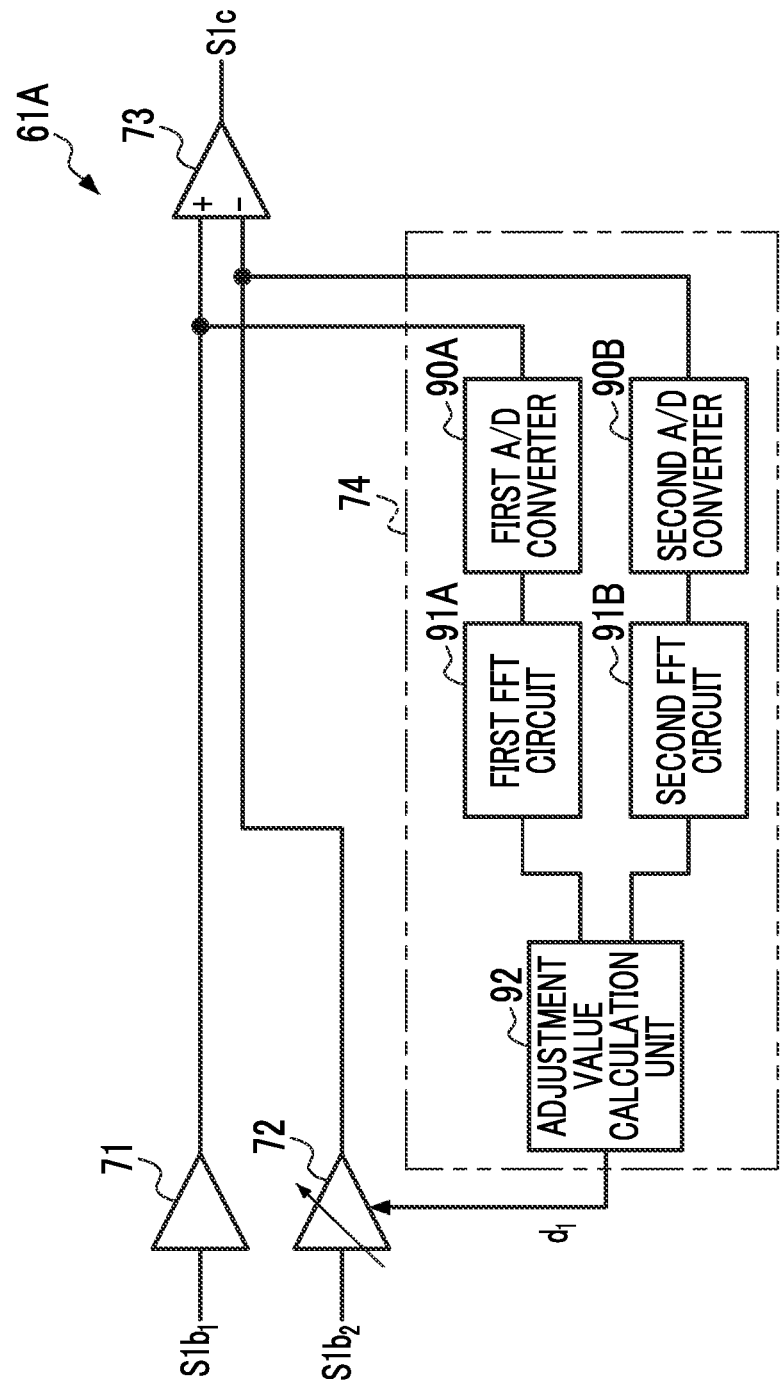
FIG. 27 is a circuit diagram showing an example in which a gain adjustment circuit is configured by a digital arithmetic circuit.

FIG. 27 shows an example in which the gain adjustment circuit 74 in the first signal processing unit 61A includes a digital arithmetic circuit. In FIG. 27, the gain adjustment circuit 74 includes a first analog to digital (A/D) converter 90A, a second A/D converter 90B, a first fast Fourier transform (FFT) circuit 91A, a second FFT circuit 91B, and an adjustment value calculation unit 92.

The signal S1$b_1$ is input to the first A/D converter 90A from the first angle detection sensor 11A via the buffer amplifier 71. The signal S2$b_2$ is input to the second A/D converter 90B from the first angle detection sensor 11B via the variable gain amplifier 72. The first A/D converter 90A converts the input signal S1$b_1$ into a digital signal and inputs the signal to the first FFT circuit 91A. The second A/D converter 90B converts the input signal S2$b_2$ into a digital signal and inputs the signal to the second FFT circuit 91B.

Figure 28:
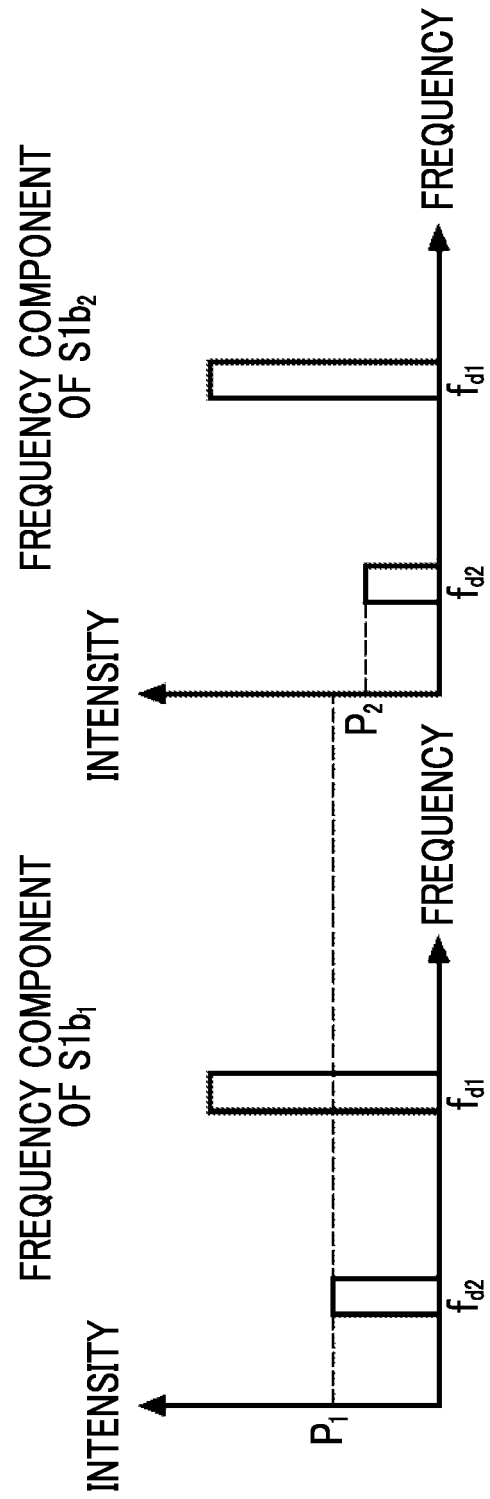
FIG. 28 is a graph showing an example of a frequency component of an output signal of the first angle detection sensor.

The first FFT circuit 91A decomposes the signal S1$b_1$ into frequency components by performing a Fourier transform on the input signal S1$b_1$. The second FFT circuit 91B decomposes the signal S2$b_2$ into frequency components by performing a Fourier transform on the input signal S1$b_2$. As shown in FIG. 28, in the signal S1$b_1$ and the signal S2$b_2$, frequency components appear in the vicinity of the first driving frequency $fd_1$ and the second driving frequency $fd_2$. The frequency component in the vicinity of the second driving frequency $fd_2$ (hereinafter, referred to as a low-frequency component) is caused by the vibration noise RN1.

The adjustment value calculation unit 92 determines the value $d_1$ as the gain adjustment value such that an intensity $P_1$ of the low-frequency component of the signal S1$b_1$ matches an intensity $P_2$ of the low-frequency component of the signal S2$b_2$. Specifically, the adjustment value calculation unit 92 calculates a value $d_1$ that satisfies "$P_1 - d_1 \times P_2 = 0$", and inputs the calculated value $d_1$ to a gain adjustment terminal of the variable gain amplifier 72.

Similarly, the gain adjustment circuit 84 in the second signal processing unit 61B can also include a digital arithmetic circuit. In this case, the gain adjustment circuit 84 has the same configuration as the gain adjustment circuit 74 shown in FIG. 27 except that the value $d_2$ as the gain adjustment value is determined such that an intensity of the high-frequency component (frequency component in the vicinity of the first driving frequency $f_{d1}$) of the signal S2$b_1$ matches an intensity of the high-frequency component of the signal S2$b_2$.

The gain adjustment circuit 74 can also be configured to calculate the value $d_1$ as the gain adjustment value such that the low-frequency component obtained by performing a Fourier transform on a subtraction signal D1 represented by the following equation is 0.

$$D1 = S1b_1 - d_1 \times S1b_2$$

Similarly, the gain adjustment circuit 84 can also be configured to calculate the value $d_2$ as the gain adjustment value such that the high-frequency component obtained by performing a Fourier transform on a subtraction signal D2 represented by the following equation is 0.

$$D2 = S2b_1 - d_2 \times S2b_2$$

All documents, patent applications, and technical standards mentioned in this specification are incorporated herein by reference to the same extent as in a case where each document, each patent application, and each technical standard are specifically and individually described by being incorporated by reference.

What is claimed is:

1. An optical scanning device comprising:
   a mirror portion having a reflecting surface for reflecting incident light;
   a first actuator that allows the mirror portion to swing around a first axis;
   a second actuator that allows the mirror portion to swing around a second axis which is orthogonal to the first axis;
   a first angle detection sensor that outputs a signal corresponding to an angle of the mirror portion around the first axis;
   a second angle detection sensor that outputs a signal corresponding to an angle of the mirror portion around the second axis; and
   at least one processor,
   wherein the processor applies a first driving signal having a first driving frequency, which is set as to match a resonance frequency around the first axis of the mirror portion, to the first actuator, applies a second driving signal having a second driving frequency, which is different from the first driving frequency and is set as to match a resonance frequency around the second axis of the mirror portion, to the second actuator, generates a first angle detection signal by performing first frequency filter processing on an output signal of the first angle detection sensor, extracting a signal component from a first frequency band centered around the first driving frequency, while excluding components from the second driving frequency, generates a second angle detection signal by performing second frequency filter processing on an output signal of the second angle detection sensor, extracting a signal component from a second frequency band centered around the second driving frequency, while excluding components from the first driving frequency, derives a first angle, which is the angle of the mirror portion around the first axis, based on the first angle detection signal, derives a second angle, which is the angle of the mirror portion around the second axis, based on the second angle detection signal, adjusts the first driving signal based on the first angle, and adjusts the second driving signal based on the second angle.

2. The optical scanning device according to claim 1, wherein the processor adjusts the first driving signal in a case where the first angle does not satisfy a first condition, and adjusts the second driving signal in a case where the second angle does not satisfy a second condition.

3. The optical scanning device according to claim 1, wherein the processor adjusts voltage values of the first driving signal and the second driving signal.

4. The optical scanning device according to claim 1, wherein each of the first angle detection sensor and the second angle detection sensor is a piezoelectric element.

5. The optical scanning device according to claim 1, wherein each of the first driving signal and the second driving signal is a sinusoidal wave.

6. The optical scanning device according to claim 1, wherein each of the first angle and the second angle is an angle representing a maximum deflection angle of the mirror portion, and the processor adjusts amplitudes of the first driving signal and the second driving signal based on the first angle and the second angle.

7. An image drawing system comprising:

the optical scanning device according to claim 1; and a light source that irradiates the mirror portion with light, wherein the processor drives the light source based on the first angle and the second angle.

8. The image drawing system according to claim 7, wherein the processor controls a light irradiation timing of the light source based on the first angle and the second angle.

9. A method of driving an optical scanning device including a mirror portion having a reflecting surface for reflecting incident light, a first actuator that allows the mirror portion to swing around a first axis, a second actuator that allows the mirror portion to swing around a second axis which is orthogonal to the first axis, a first angle detection sensor that outputs a signal corresponding to an angle of the mirror portion around the first axis, and a second angle detection sensor that outputs a signal corresponding to an angle of the mirror portion around the second axis, the method comprising:

applying a first driving signal having a first driving frequency, which is set as to match a resonance frequency around the first axis of the mirror portion, to the first actuator;

applying a second driving signal having a second driving frequency, which is different from the first driving frequency and is set as to match a resonance frequency around the second axis of the mirror portion, to the second actuator;

generating a first angle detection signal by performing first frequency filter processing on an output signal of the first angle detection sensor, extracting a signal component from a first frequency band centered around the first driving frequency, while excluding components from the second driving frequency;

generating a second angle detection signal by performing second frequency filter processing on an output signal of the second angle detection sensor, extracting a signal component from a second frequency band centered around the second driving frequency, while excluding components from the first driving frequency;

deriving a first angle, which is the angle of the mirror portion around the first axis, based on the first angle detection signal;

deriving a second angle, which is the angle of the mirror portion around the second axis, based on the second angle detection signal;

adjusting the first driving signal based on the first angle; and adjusting the second driving signal based on the second angle.

* * * * *